(12) United States Patent
Matsuya

(10) Patent No.: US 7,015,481 B2
(45) Date of Patent: Mar. 21, 2006

(54) CHARGED-PARTICLE OPTICAL SYSTEM

(75) Inventor: Miyuki Matsuya, Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 10/778,937

(22) Filed: Feb. 13, 2004

(65) Prior Publication Data
US 2004/0227099 A1 Nov. 18, 2004

(30) Foreign Application Priority Data
Feb. 14, 2003 (JP) ............................ 2003-036507

(51) Int. Cl.
*H01J 3/14* (2006.01)
(52) U.S. Cl. .................. 250/398; 250/310; 250/396 R
(58) Field of Classification Search ................. 250/398
See application file for complete search history.

(56) References Cited

U.S. PATENT DOCUMENTS 6,627,890 B1 * 9/2003 Lanio ......................... 250/311
6,770,887 B1 * 8/2004 Krivanek et al. ....... 250/396 R

OTHER PUBLICATIONS

Von H. Rose, *Optik 33*, Heft 1, 1-24 (1971).
Von H. Rose, *Optik 34*, Heft 3, 285-311 (1971).
M. Haider et al., "Design and test of an electric and magnetic dodecaple lens", *Optik 63*, No. 1, 9-23 (1982).
J. Zach, "Design of a high-resolution low-voltage scanning electron microscope", *Optik 83*, No. 1, 30-40 (1989).
Joachim Zach et al., "Aberration correction in a low voltage SEM by a multipole corrector", *Nucl. Instr. and Meth. in Phys. Res. A 363*, 316-325 (1995).

* cited by examiner

*Primary Examiner*—John R. Lee
*Assistant Examiner*—Phillip A Johnston
(74) *Attorney, Agent, or Firm*—The Webb Law Firm

(57) ABSTRACT

On a charged-particle optical system for achieving optimum aberration correction and obtaining a minimum probe diameter, the optical system focuses a beam of charged particles onto a surface of a specimen, and has four stages of multipole elements arranged along the optical axis of the beam, power supplies capable of supplying five or more independent octopole electric or magnetic potentials, and a control portion for correcting third-order aperture aberrations by adjusting the five or more independent octopole electric or magnetic potentials independently. The power supplies apply normal octopole electric or magnetic potentials to at least three of the four stages of multipole elements independently and apply skew octopole electric or magnetic potentials to at least two of the multipole elements independently.

15 Claims, 8 Drawing Sheets

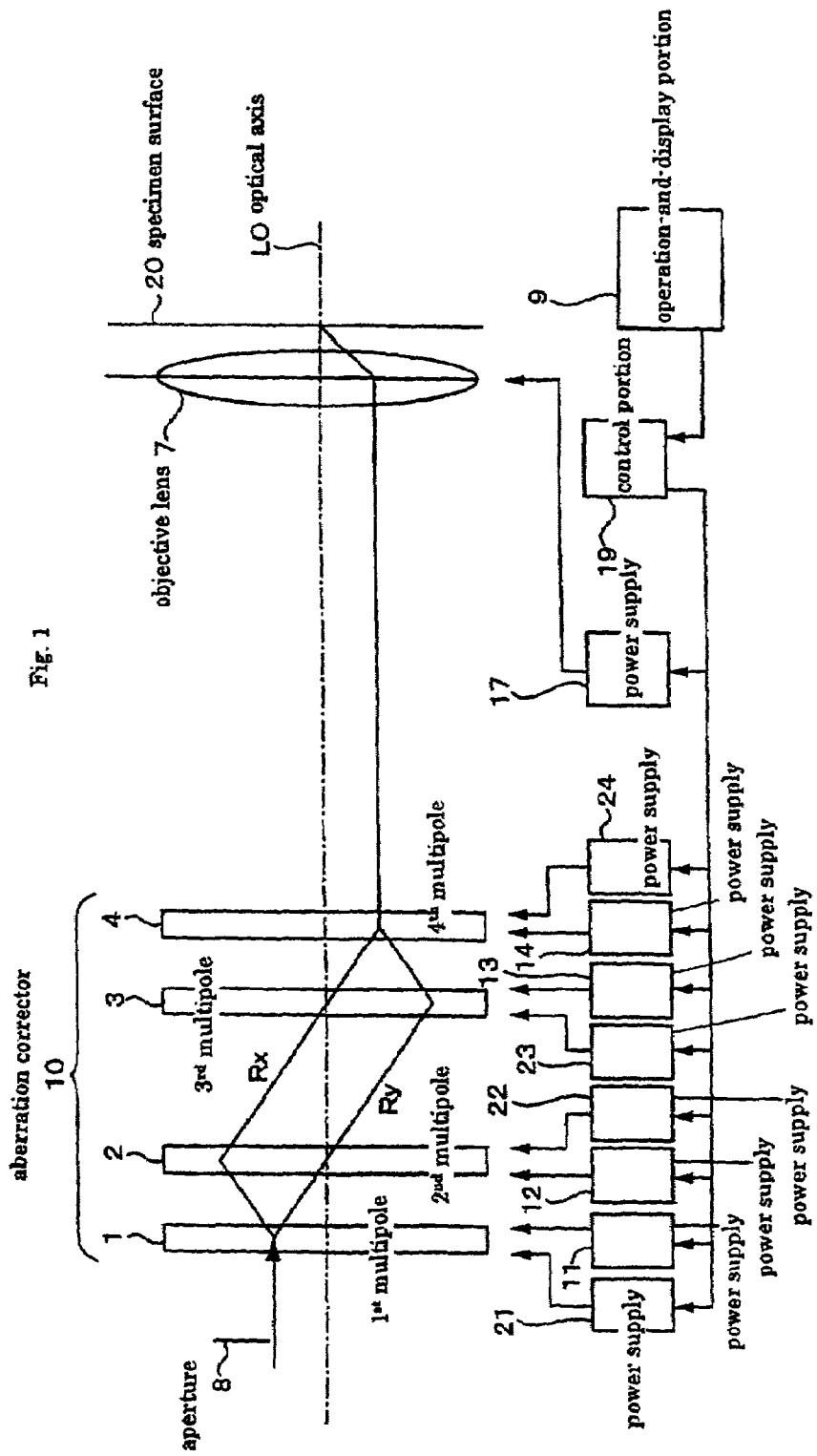

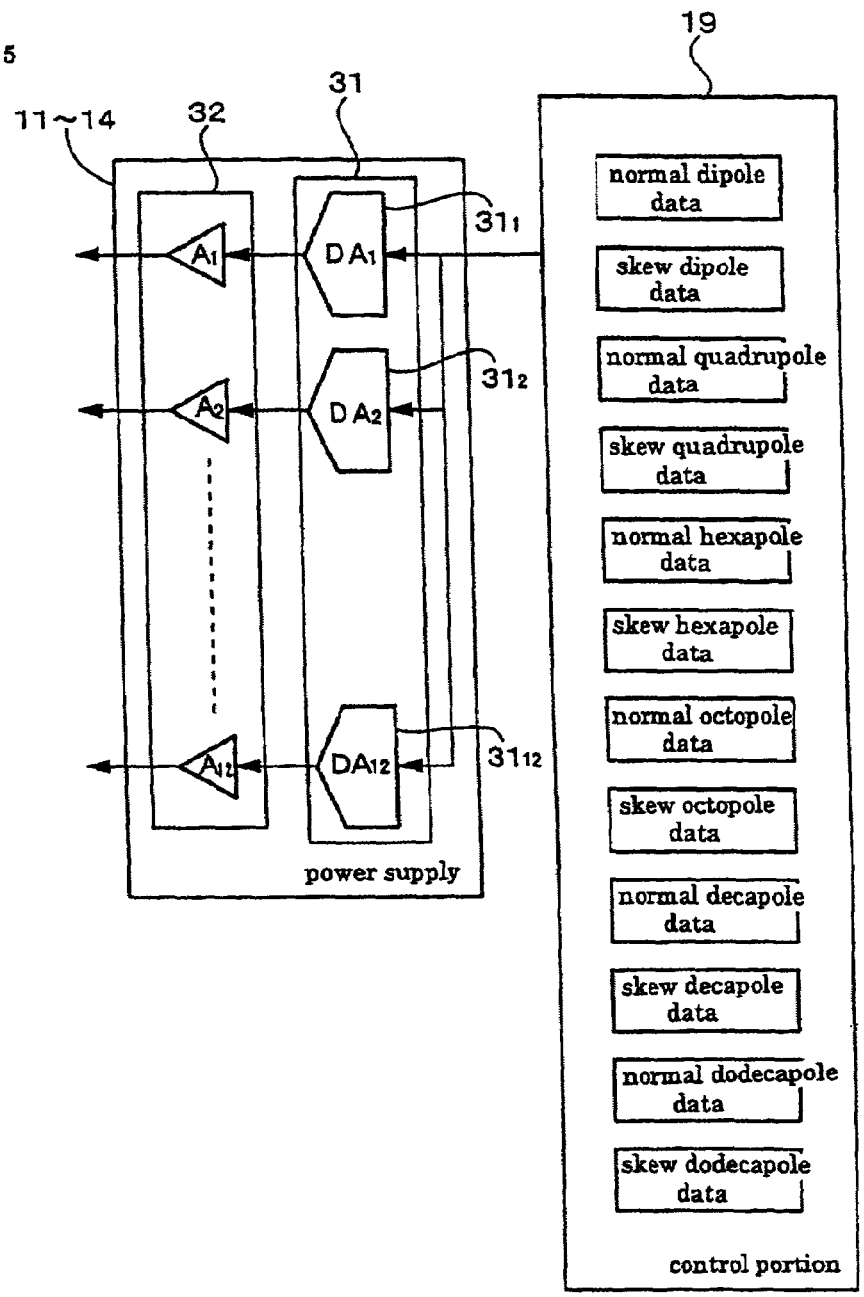

CHARGED-PARTICLE OPTICAL SYSTEM

BACKGROUND OF THE INVENTION

1. Field of the Invention

The present invention relates to a charged-particle optical system for use in an electron beam instrument (such as a scanning electron microscope) or a charged-particle beam instrument or device (such as an ion beam apparatus typified by an ion microprobe) to focus a beam of charged particles onto a specimen.

2. Description of Related Art

In a charged-particle optical system such as a scanning electron microscope or transmission electron microscope, an aberration corrector is incorporated in the charged-particle optics to enable high-resolution imaging or increase the probe current density. A system for correcting chromatic aberration by means of a combination of electrostatic quadrupole elements and magnetic quadrupole elements and for correcting spherical aberration by means of four stages of octopole elements has been proposed as such an aberration corrector. The principle is introduced in detail in H. Rose, *Optik* 33, Heft 1, 1–23, (1971); J. Zach, *Optik* 83, No. 1, 30–40 (1989); J. Zach and M. Haider, *Nucl. Instr. and Meth. In. Phys. Res.* A 363, 316–325 (1995)).

The principle of the above-described aberration corrector is briefly described by referring to FIG. 6, where the aberration corrector 10, is positioned ahead of an objective lens 7. The corrector 10 has four stages of multipole elements 1, 2, 3, and 4. An aperture baffle 8 is mounted ahead of the corrector 10. The principal plane of the objective lens 7 is indicated by PP.

In this configuration, a beam of charged particles enters from the left side as viewed in the figure along the optical axis LO. The four stages of multipole elements 1–4 are used as electrostatic quadrupole elements. (As used herein, the term "multipole element" refers to a symmetrically arranged set of electrodes or pole pieces. Each "stage" is comprised of a "multiple element.") These quadrupole elements cooperate with the objective lens 7 to create a reference orbit for the beam of charged particles. The beam of charged particles is brought into focus onto a specimen surface 20. In this FIG. 6, the direction of the optical axis LO along which the beam of charged particles travels is taken as the Z-direction. The orbit $R_x$ of the beam of particles in the X-direction perpendicular to the Z-direction and the orbit $R_y$ in the Y-direction are both schematically drawn on the same plane.

The structures of the multipole elements 1–4 are next described in detail. FIGS. 7(A) and 7(B) show examples of the multipole elements using dodecapole (12-pole) elements. In FIG. 7(A), a multipole element made up of an electrostatic dodecapole element is shown.

In these configurations, voltages can be independently applied to electrodes $U_1$ to $U_{12}$ forming twelve poles. That is, in these illustrated examples, amplifiers $A_1$ to $A_{12}$ in a supply portion 105 supply electric potentials to the electrodes $U_1$ to $U_{12}$, respectively, according to electric potentials supplied from power supplies 101, 102, 103, and 104, respectively. The power supply 101 is used for generating normal and skew dipole fields. The power supply 102 is used for generating normal and skew quadrupole fields. The power supply 103 is used for generating normal and skew hexapole fields. The power supply 104 is used for generating normal octopole fields.

Where the dipole fields or elements are expressed using general words, dipole elements for normal components are used for deflection in the X-direction, while dipole elements for skew components are used for deflection in the Y-direction.

In FIG. 7(B) shows a multipole element made up of a dodecapole element for creating superimposed electric and magnetic fields. In this configuration, the 12 electrodes $W_1$ to $W_{12}$ acting also as magnetic pole pieces are made of a magnetic material. Coils for supplying exciting currents to the electrodes are mounted on these electrodes $W_1$ to $W_{12}$. The electric potential and magnetization can be controlled for each of these electrodes (pole pieces) $W_1$ to $W_{12}$.

The supply portion 105 applies electric potentials to the electrodes $W_1$ to $W_{12}$. In this illustrated example, amplifiers $B_1$ to $B_{12}$ in the supply portion 112 supply exciting currents to the respective coils mounted on the electrodes (pole pieces) $W_1$ to $W_{12}$ according to normal quadrupole power supply 111.

A method of using a dodecapole (12-pole) element to superimposed electric and magnetic fields and using them as dipoles through dodecapole elements of the electric and magnetic field type is shown in M. Haider, W. Bernhardt and H. Rose, *Optik* 64, No. 1, 9–23 (1982), especially Table 1.

The configuration of FIG. 7(B) is so constructed that the voltages to the electrodes of the multipole elements and the exciting currents to the magnetic pole pieces are controlled independently because the dodecapole element is used as plural multipole elements. Where the used multipole elements are restricted to only quadrupole and octopole elements, for example, the number of power supplies can be reduced accordingly.

FIG. 8 shows various multipole potentials or multipole elements achieved using a dodecapole element. The configurations of FIG. 8 show examples of an arrangement of the electrodes of electrostatic multipole potentials or multipole elements.

Usually, a multipole field generated by the electrostatic potentials or element having functions equivalent to those of a structure having a reference electrode on the X-axis is known as a normal 2n-pole field or element (n=1, 2, . . . ). A multipole field generated by the electrostatic potentials or element having functions equivalent to those of a structure obtained by rotating the normal 2n-pole element through half of the angular pitch (=2π/4n=π/2n [rad] or 90/n [deg]) between the successive electrodes is known as a skew 2n-pole field or element.

Similarly, in the magnetic field type, a multipole field generated by the magnetic potentials or element having functions equivalent to those of a structure using electrostatic skew 2n-pole electrodes replaced by magnetic pole pieces is known as a normal 2n-pole field or element. A multipole field generated by the magnetic potentials or element having functions equivalent to those of a structure using electrostatic normal 2n-pole electrodes replaced by magnetic pole pieces is known as a skew 2n-pole field or element.

The arrangement of electrodes and magnetic pole pieces of normal multipole elements (or skew multipole elements) is different between electrostatic and magnetic field type, because the directions in which charged particles undergo forces from their fields are selected to be on the same straight line. In the following description, in cases where it is not necessary to discriminate between these electrodes and magnetic pole pieces, they may be simply referred to as multipole elements.

Actual operation using these multipole elements 1–4 is next described by referring to FIG. 6. A normal dipole field or element is a deflector for deflection in the X-direction. A skew dipole field or element is a deflector for deflection in the Y-direction. They are used for axial alignment but their detail description is omitted herein.

Focus adjustment, which can be grasped as a problem occurring when a reference orbit is created, is first described.

A reference orbit can be a paraxial orbit characterized as follows. A quadrupole created by the first stage of multipole element 1 causes the orbit $R_y$ in the Y-direction to pass through the center of a quadrupole created by the second stage of multipole element 2. A quadrupole created by the second stage of multipole element 2 causes the orbit $R_x$ in the X-direction to pass through the center of a quadrupole created by the third stage of multipole element 3. Finally, a quadrupole created by the third stage of multipole element 3 and a quadrupole created by the fourth stage of multipole element 4 cooperate with the objective lens 7 to bring the beam of particles into focus onto the specimen surface 20. Practically, these elements need to be adjusted mutually to achieve complete focusing.

Where the image is not made clear only by focus adjustments in the X- and Y-directions, skew quadrupole potentials may be used in some cases.

Chromatic aberration correction is next described. In this system, in order to correct chromatic aberration, the electric potential $\phi_{q2}$ [V] at the electrostatic quadrupole of the second stage of multipole element 2 and the magnetization (or excitation) $J_2$ [AT] (ampere turn or magnetic potential) at the magnetic quadrupole are adjusted so as not to vary the aforementioned reference orbit. With respect to the whole lens system, the chromatic aberration in the X-direction is corrected to zero. Similarly, the electric potential $\phi_{q3}$ [V] at the electrostatic quadrupole in the third stage of multipole element 3 and the magnetization (or excitation) $J_3$ [AT] at the magnetic quadrupole are adjusted so as not to vary the reference orbit. With respect to the whole particle optical system, chromatic aberration is corrected to zero in the Y-direction.

Correction of second-order aperture aberrations is next described. In this embodiment, correction of the second-order aperture aberrations using hexapole elements is described. Ideally, second-order aperture aberrations should not be produced. In practice, however, such aberrations occur parasitically to the aberration corrector 10 due to limitations of mechanical accuracies. After correcting chromatic aberration in the X- and Y-directions, second-order aperture aberrations in the X-direction are corrected to zero over the whole lens system by the electric potential $\psi_{s2}$ [V] at an electrostatic hexapole created by the second stage of multipole element 2. Second-order aperture aberrations in the Y-direction are corrected to zero by the electric potential $\psi_{s3}$ [V] at an electrostatic hexapole created by the third stage of multipole element 3. Then, second-order aperture aberrations in the resultant direction of the X- and Y-directions (e.g., a direction making an angle of 30° or 60° to the X-axis) is corrected to zero by the electrostatic hexapoles of the first stage of multipole element 1 and fourth stage of multipole element 4.

Correction of spherical aberration, which can be grasped as a problem occurring in correcting third-order aperture aberrations is next described. Where spherical aberration is corrected, the third-order aperture aberration in the X-direction is corrected to zero over the whole lens system by the electric potential $\psi_{o2}$ [V] at an electrostatic octopole created by the second stage of multipole element 2. Third-order aperture aberration in the Y-direction is corrected to zero by the electric potential $\psi_{o3}$ [V] at an electrostatic octopole created by the third stage of multipole element 3. Then, third-order aperture aberration in a 45°-direction that is the resultant direction of the X- and Y-directions is corrected to zero by the electrostatic octopoles created by the first stage of multipole element 1 and fourth stage of multipole element 4. Practically, alternate iterative adjustments are necessary.

Correction of higher-order aperture aberrations is next described. In this embodiment, correction of fifth-order aperture aberrations is discussed.

Where the contribution of fifth-order aberrations is reduced to a minimum, a method of correcting fifth-order aberrations by a dodecapole element see H. Rose, *Optik* 34, Heft 3, 285–311 (1971), a method of minimizing the contribution of the fifth-order aberrations by adjusting the sign and amount of third-order aperture aberrations such as Haider, supra, and other methods are available. These methods are not described in detail herein.

The aforementioned theories and experiments have revealed that the prior art, for example, shown in FIGS. 6 and 7 is excellent. However, sufficient considerations have not been given to achieving still smaller probes. The problems with the prior art system are described below.

First, where hexapole components are produced within the aberration corrector due to mechanical inaccuracy, it is necessary to correct second-order aperture aberrations by hexapole fields. In addition, the hexapole components affect fourth-order aperture aberrations, too. Accordingly, where higher resolution should be obtained, fourth-order aperture aberrations contributing much must be corrected before fifth-order aperture aberrations. That is, it is necessary to correct fourth-order aperture aberrations by decapole (10-pole) fields.

Secondly, where the aforementioned hexapole components are produced, it is considered that skew hexapole components are present, as well as normal hexapole components. In the correction of second-order aperture aberrations as already described as the prior art, second-order aperture aberrations in the X-direction are corrected by the normal hexapole fields. In addition, second-order aperture aberrations in the Y-direction are corrected by the skew hexapole fields. If the skew components are present, spherical aberration cannot be completely reduced to zero with only normal octopole fields that correct spherical aberration (third-order aperture aberrations). That is, it is necessary to correct spherical aberration by skew octopole fields.

Thirdly, if the aforementioned second skew hexapole components are present, fourth-order aperture aberrations cannot be completely reduced to zero with only normal decapole (10-pole) fields. That is, it is necessary to correct the fourth-order aperture aberrations by skew decapole fields.

Similarly, if there are skew hexapole components, fifth-order aperture aberrations cannot be completely made zero with only normal dodecapole fields. That is, it is necessary to correct the fifth-order aperture aberrations by skew dodecapole fields.

SUMMARY OF THE INVENTION

It is an object of the present invention to provide a charged-particle optical system capable of achieving optimum aberration correction and producing a minimum probe diameter by solving the foregoing problems that have not been taken into consideration in the past.

To achieve this object, the present invention provides a charged-particle optical system for focusing a beam of charged particles onto a specimen, the optical system having (1) four stages of multipole elements arranged along the optical axis of the beam of charged particles, (2) independently variable power supplies capable of supplying five or more independent octopole electric potentials or magnetic potentials, (3) fixed or non-independently variable power supplies capable of supplying one or more octopole electric potentials or magnetic potentials, and (4) a control means for correcting third-order aperture aberrations by independently adjusting the octopole electric potentials or magnetic potentials of the five or more independently variable power supplies. The (2) independently variable power supplies apply electric or magnetic potentials for generating normal octopole fields to at least three stages of multipole elements of the four stages of multipole elements independently and apply electric or magnetic potentials for generating skew octopole fields to at least two of the multipole elements independently. The (3) non-independently variable power supplies apply electric or magnetic potentials for generating normal or skew octopole fields having values that are constant or dependent on any value of the independently variable power supplies to at least one stage of multipole element of the four stages of multipole elements.

Preferably, the control means is a computer for executing a sequence of corrective operations based on a given program.

Preferably, at least two of the electric or magnetic potentials for generating the three or more independent normal octopole fields are applied to the central second and third stages of multipole elements, and at least two of the electric or magnetic potentials for generating the two or more independent skew octopole fields are applied to the first and fourth stages of multipole elements.

Another charged-particle optical system according to the invention focuses a beam of charged particles onto a specimen, the optical system preferably having (1) four stages of multipole elements arranged along the optical axis of the beam of charged particles, (2) independently variable power supplies capable of supplying six or more independent decapole electric or magnetic potentials, (3) fixed or non-independently variable power supplies capable of supplying one or more decapole electric or magnetic potentials, and (4) a control means for correcting fourth-order aperture aberrations by adjusting the decapole electric or magnetic potentials of the six or more independently variable power supplies independently. The (2) independently variable power supplies apply, electric or magnetic potentials for generating normal decapole fields to at least three stages of multipole elements of the four stages of multipole elements independently and apply electric or magnetic potentials for generating skew decapole fields to at least three of the stages of multipole elements independently. The (3) non-independently variable power supplies apply electric or magnetic potentials for generating normal or skew decapole fields having values that are constant or dependent on any value of the independently variable power supplies to at least one multipole element of the four stages of multipole elements.

Preferably, at least one of the electric or magnetic potentials for generating the three or more independent normal decapole fields is applied to the second stage multipole element, and at least one of the electric or magnetic potentials for generating the two or more independent skew decapole fields is applied to the third stage multipole element.

Preferably, at least three of the electric or magnetic potentials for generating the three or more independent normal decapole fields are applied to the first, second, and fourth stages of multipole elements, and at least three of the electric or magnetic potentials for generating the three or more independent skew decapole fields are applied to the first, third, and fourth stages of multipole elements.

A further charged-particle optical system according to the invention focuses a beam of charged particles onto a specimen, the optical system preferably having (1) four stages of multipole elements arranged along the optical axis of the beam of charged particles, (2) independently variable power supplies capable of supplying seven independent dodecapole (12-pole) electric or magnetic potentials, (3) a fixed or non-independently variable power supply capable of supplying one dodecapole electric or magnetic potential, and (4) a control means for correcting fifth-order aperture aberrations by adjusting dodecapole electric or magnetic potentials of the seven independently variable power supplies independently. The (2) independently variable power supplies apply electric or magnetic potentials for generating normal dodecapole fields to all of the four stages of multipole elements independently and apply electric or magnetic potentials for generating skew dodecapole fields to three of the multipole elements independently. The (3) non-independently variable power supply applies an electric or magnetic potential for generating the normal or skew dodecapole field having a value that is constant or dependent on any value of the independently variable power supplies to one multipole element of the four stages of multipole elements.

Preferably, the electric or magnetic potentials for generating the three independent skew dodecapole fields are applied to the first, second, and fourth stages of multipole elements.

A still other charged-particle optical system according to the invention focuses a beam of charged particles onto a specimen, the optical system having (1) four stages of multipole elements using dodecapole elements of superimposed electric and magnetic field type in normal array arranged along the optical axis of the beam of charged particles, (2) power supplies for independently applying electric potentials for generating normal dodecapole fields to all of the four stages of multiple elements and independently applying the magnetic potentials for generating skew dodecapole fields to three of the multipole elements, (3) a fixed or non-independently variable power supply capable of supplying one dodecapole magnetic potential, and (4) a control means for correcting fifth-order aperture aberrations by independently adjusting the four independent dodecapole electric potentials and the three independent dodecapole magnetic potentials. The (3) non-independently variable power supply applies a magnetic potential for generating a skew dodecapole field having a value that is constant or dependent on any value of the independently variable power supplies to one multipole element of the four stages of multipole elements.

A yet other charged-particle optical system according to the invention focuses a beam of charged particles onto a specimen, the optical system having (1) four stages of multipole elements using dodecapole elements of the superimposed electric and magnetic field type in skew array arranged along the optical axis of the beam of charged particles, (2) power supplies for independently applying magnetic potentials for generating normal dodecapole fields to all of the four stages of multiple elements and independently applying the electric potentials for generating skew dodecapole fields to three of the multipole elements, (3) a fixed or non-independently variable power supply capable of supplying one dodecapole electric potential, and (4) a control means for correcting fifth-order aperture aberrations by adjusting the four independent dodecapole magnetic potentials and the three independent dodecapole electric potentials. The (3) non-independently variable power supply applies a skew dodecapole electric potential having a value that is constant or dependent on any value of the independently variable power supplies to one multipole element of the four stages of multipole elements.

In the charged-particle optical system according to the invention, each of the four stages of multipole elements preferably consists of a dodecapole element, and at least two central stages of the four stages of dodecapole elements are made of superimposed electric and magnetic fields. Preferably, the optical system has power supplies for supplying four independent quadrupole electric potentials to the four stages of dodecapole elements and applying at least two independent quadrupole magnetic potentials to the multipole elements of the superimposed electric and magnetic fields.

Preferably, the control means also corrects aberrations of hexapole components.

Other objects and features of the invention will appear in the course of the description thereof, which follows.

BRIEF DESCRIPTION OF THE DRAWING(S)

Figure 4A:
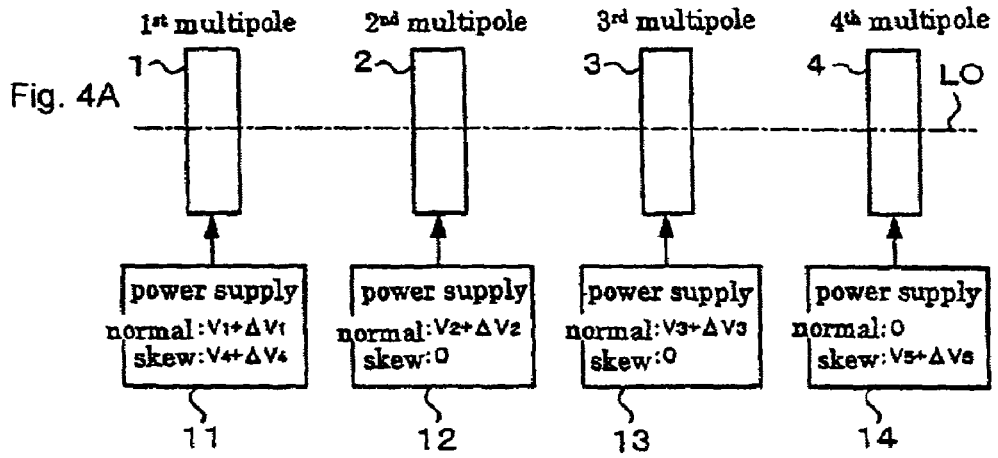
Figure 4B:
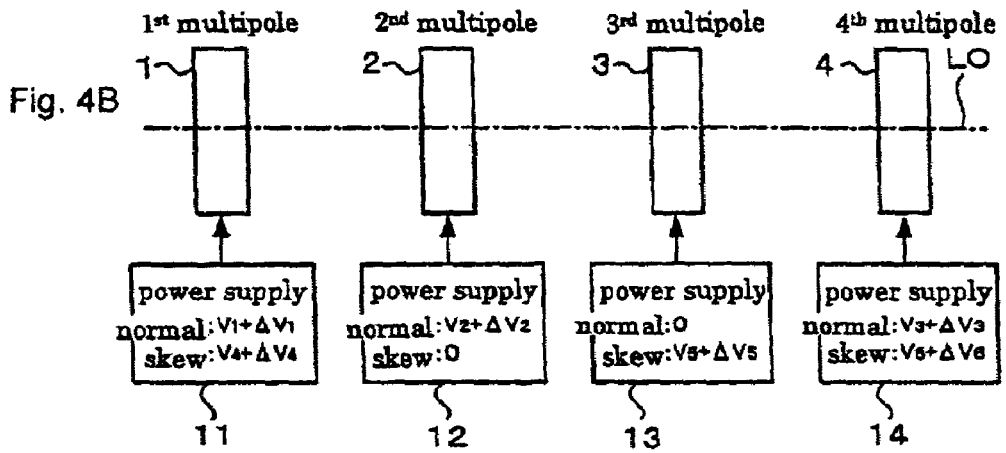
Figure 4C:
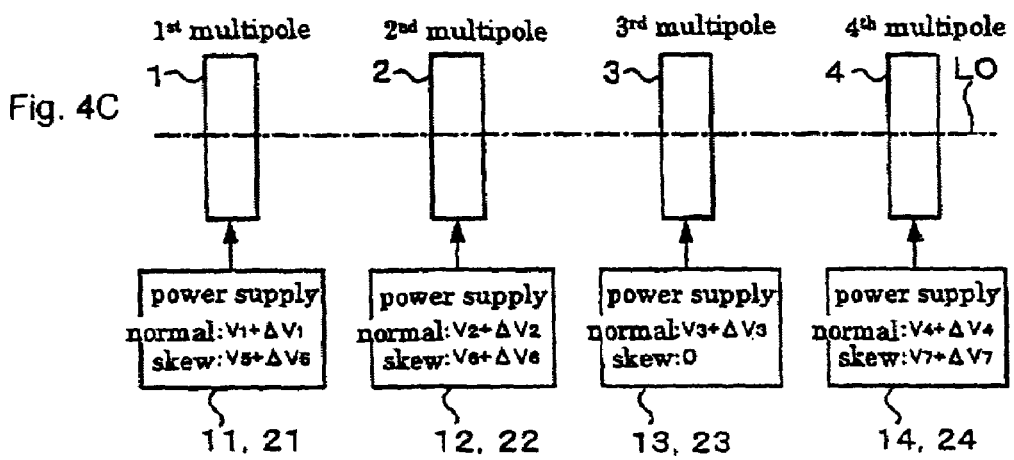
Figure 6:
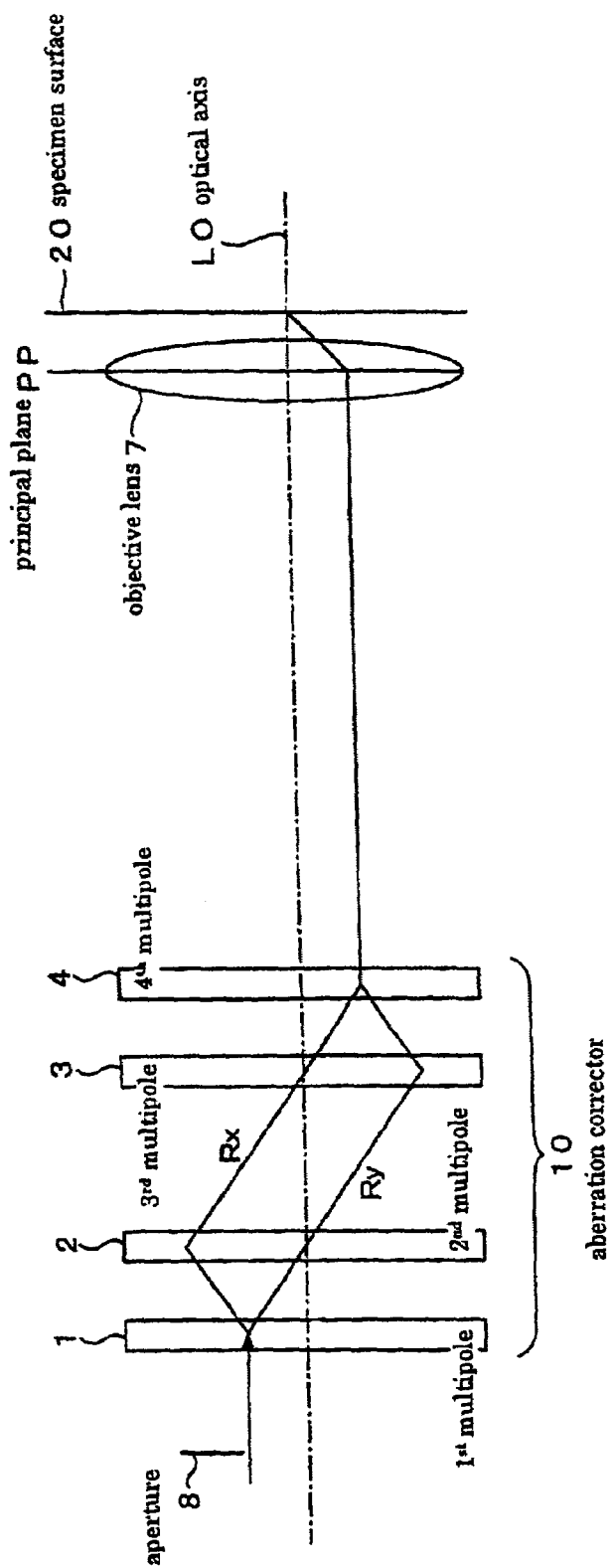
Figure 7A:
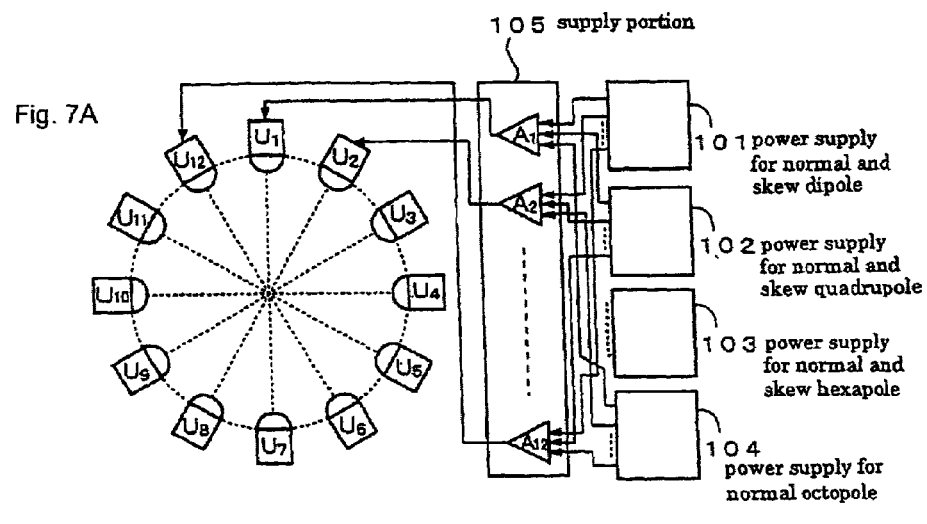
Figure 7B:
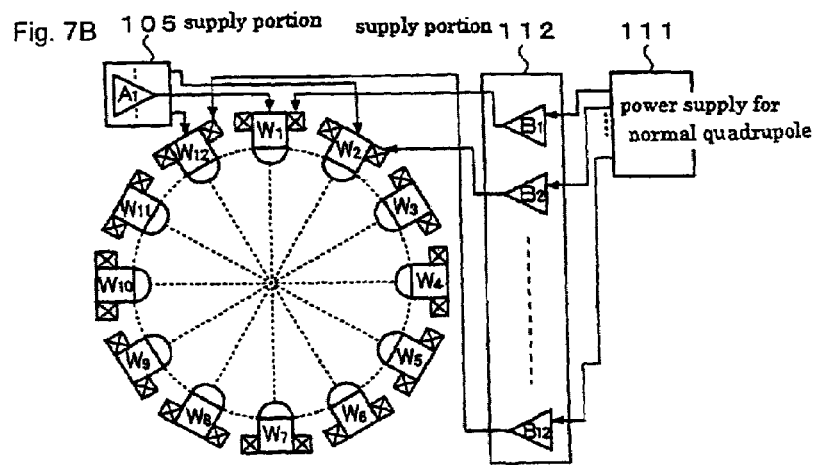
Figure 8:
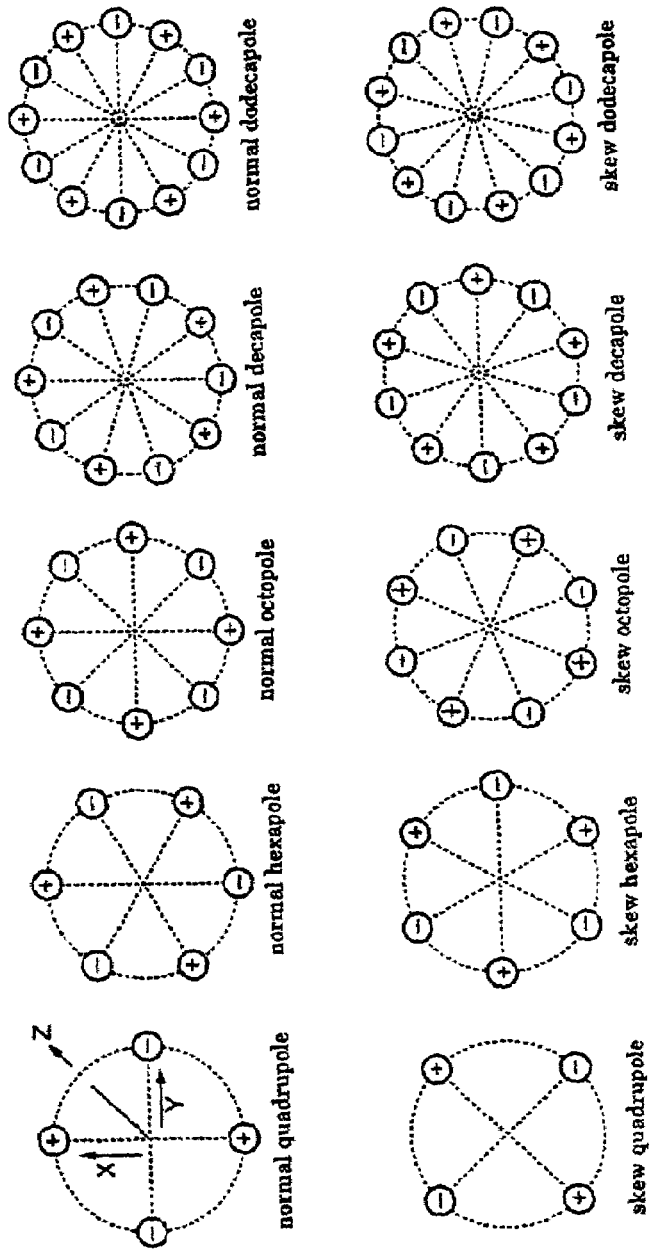
Figure 5:
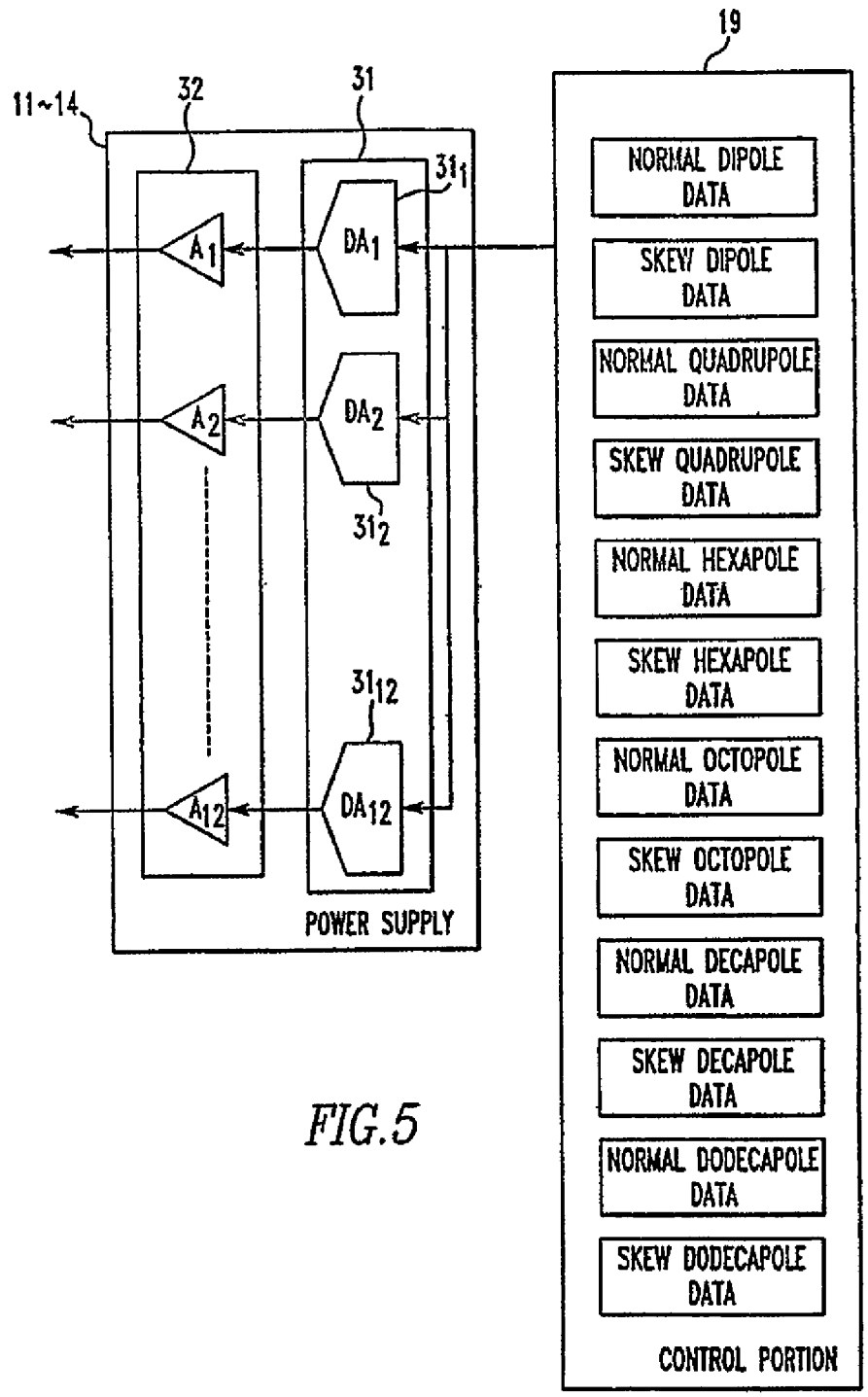
Figure 6:
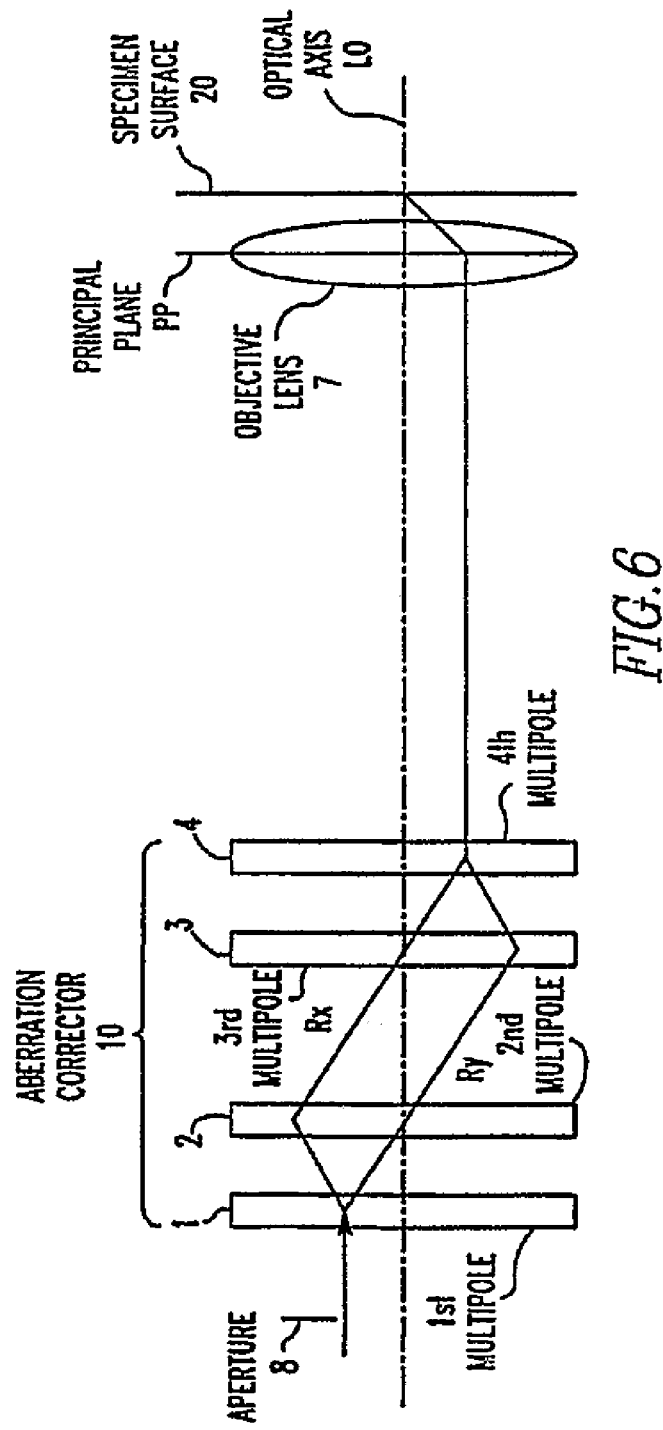
Figure 7A:
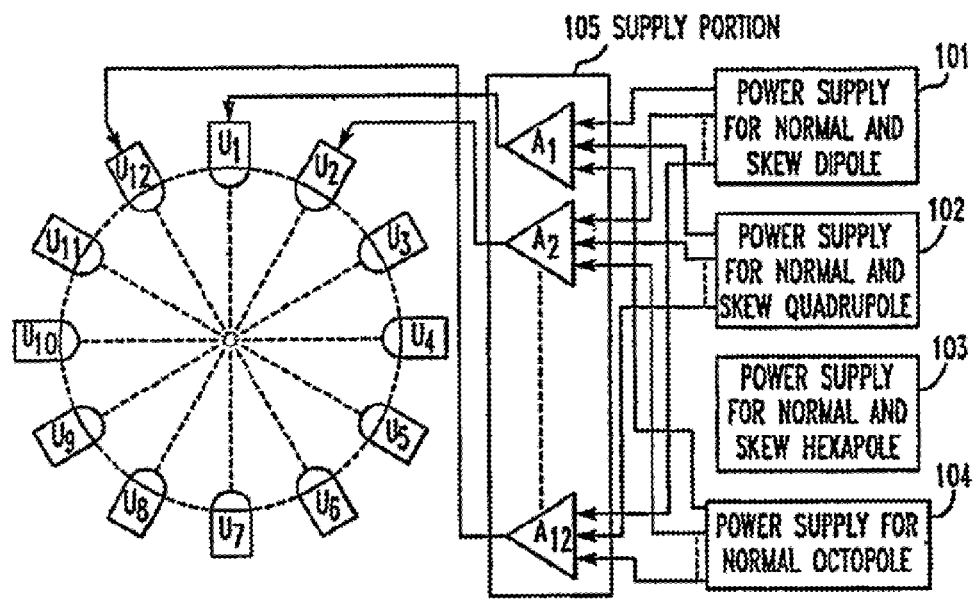
Figure 7B:
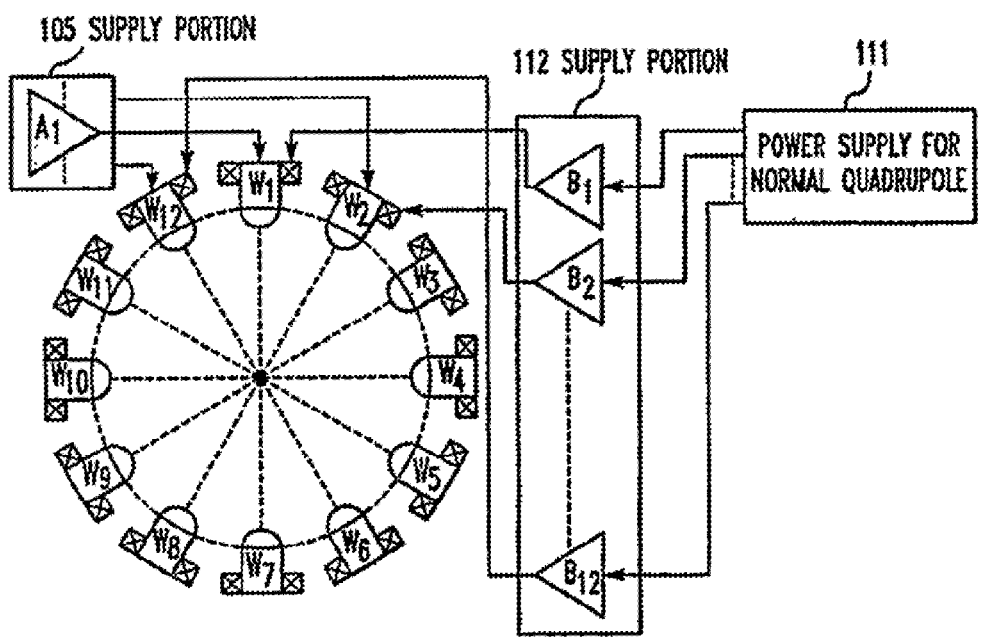

FIGS. 4(A), 4(B) and 4(C) illustrate corrections of third-order, fourth-order and fifth-order aperture aberrations using multipole elements respectively;

FIG. 5 is a diagram showing the structure of each power supply of a charged-particle optical system according to a second embodiment of the invention;

FIG. 6 is a ray diagram of the prior art charged-particle optical system;

FIG. 7(A) shows an electrostatic dodecapole element with inner radius a and FIG. 7(B) shows a dodecapole element with inner radius a using superimposed electric and magnetic fields; and FIG. 8 shows diagrams of multipole potentials achieved using a dodecapole element.

DESCRIPTION OF THE PREFERRED EMBODIMENT(S)

Charged-particle optical systems according to the preferred embodiments of the present invention are hereinafter described in detail with reference to the drawings.

Figure 1:
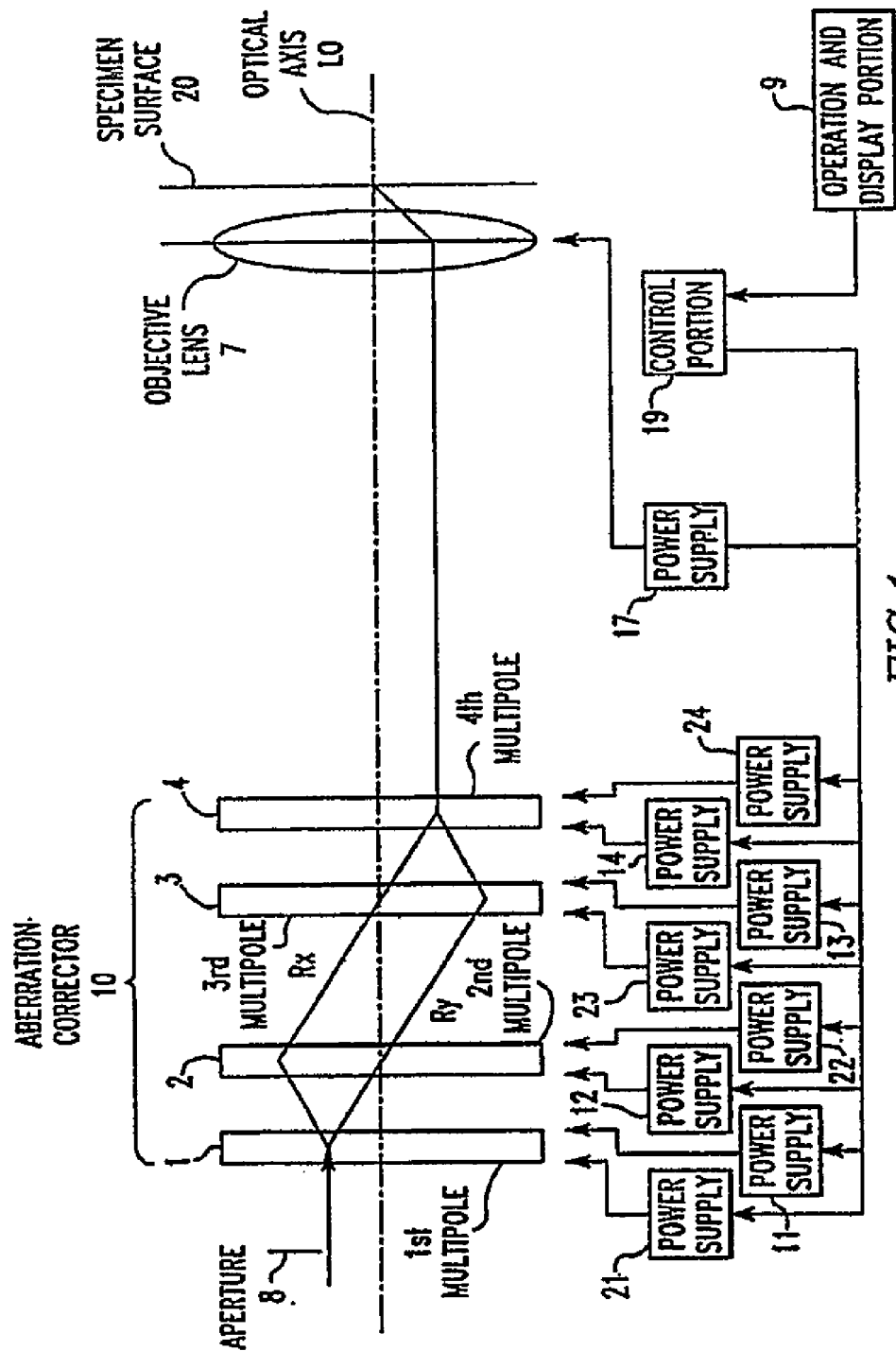
FIG. 1 is a diagram showing a charged-particle optical system according to a first embodiment of the present invention.
Figure 2:
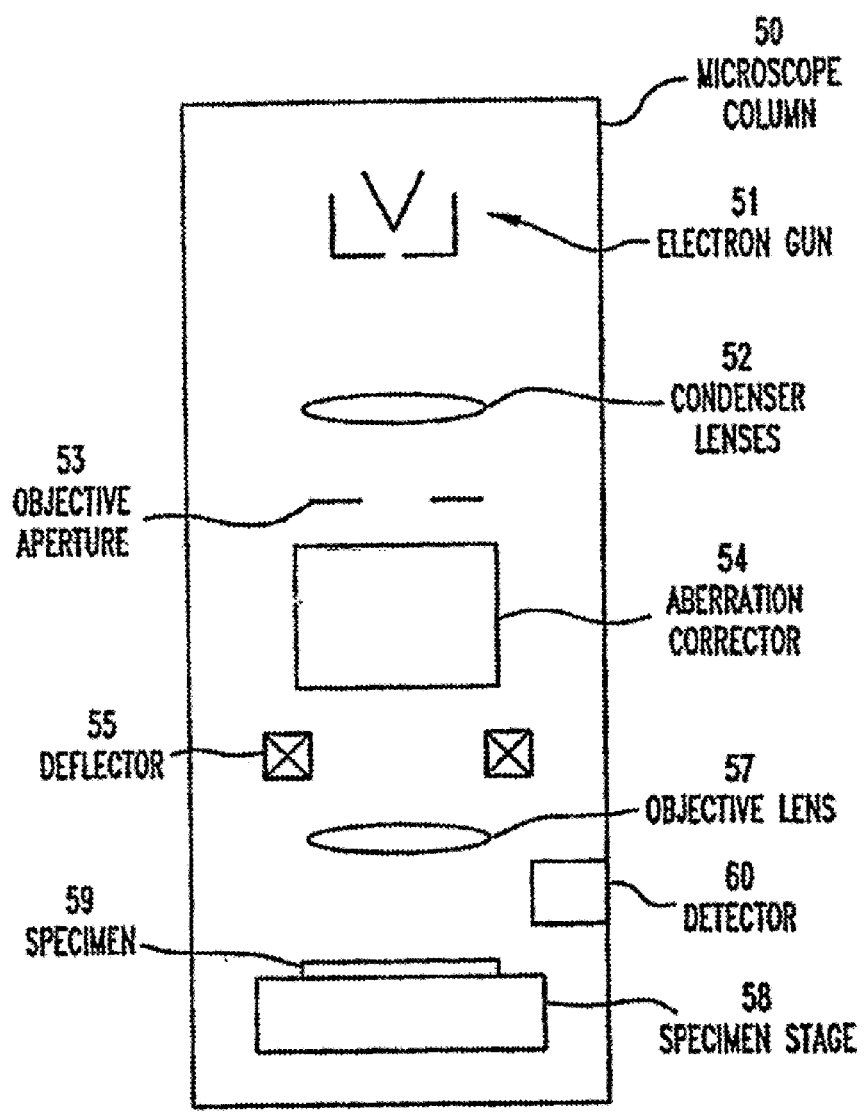
Figure 8:
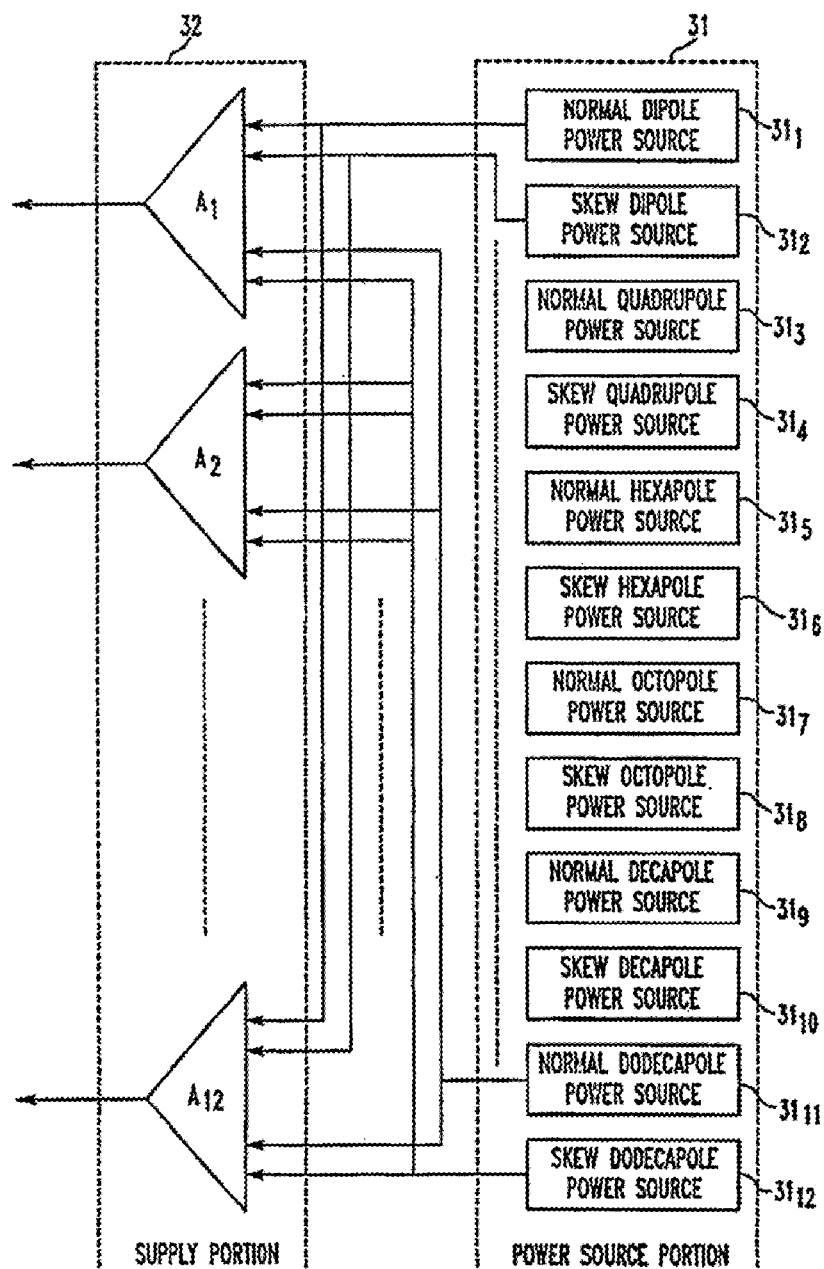
Figure 4A:
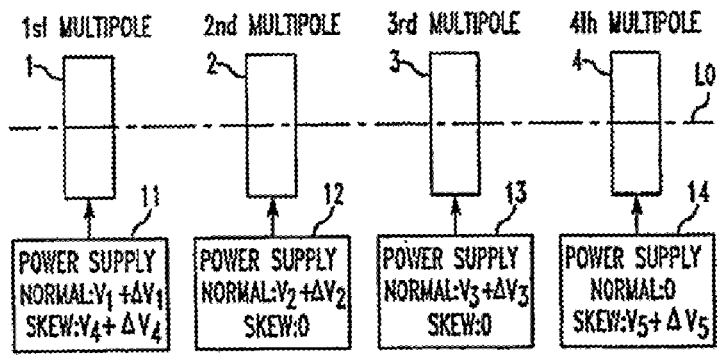
Figure 4B:
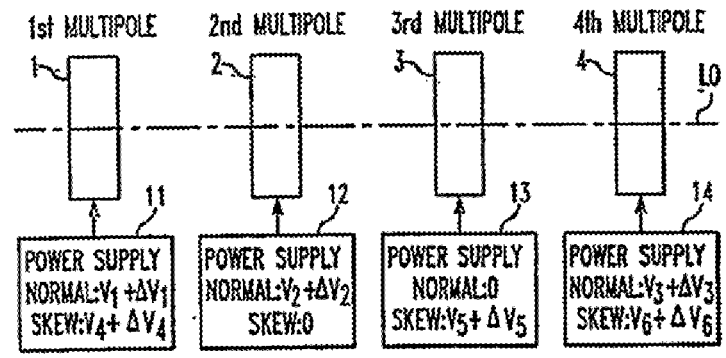
Figure 4C:
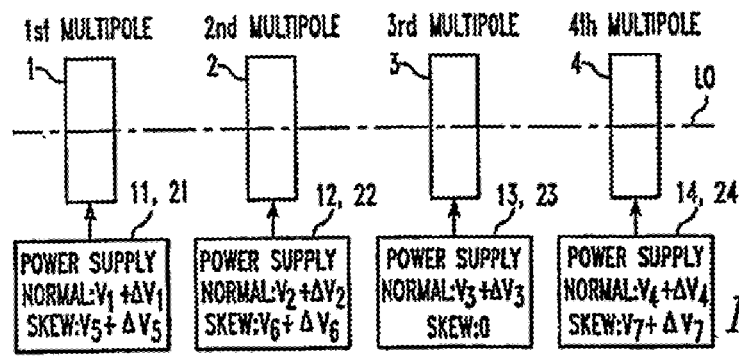

FIG. 1 shows a charged-particle optical system according to a first embodiment of the invention. In this and following embodiments, charged-particle optical systems are similar in structure unless otherwise specifically stated.

The charged-particle optical system according to the first embodiment focuses a beam of charged particles as a probe onto a specimen. The optical system has an aperture baffle 8, four stages of multipole elements 1, 2, 3, and 4, and an objective lens 7 for focusing the beam onto a specimen surface 20. These components 8, 1–4, and 7 are arranged along the optical axis LO.

In addition, this charged-particle optical system has power supplies 11, 21 for exciting the multipole element 1, power supplies 12, 22 for exciting the multipole element 2, power supplies 13, 23 for exciting the multipole element 3, power supplies 14, 24 for exciting the multipole element 4, a power supply 17 for exciting the objective lens 7, an operation-and-display portion 9 for providing a user's interface and controlling the accelerating voltage, the working distance, and other factors, and a control portion 19 for controlling the power supplies 11–14, 17, and 21–24 based on manual operations on the operation-and-display portion 9.

For the sake of convenience, the eight power supplies 11–14 and 21–24 are shown which apply electric and magnetic potentials to the four stages of multipole elements 1–4 so that aperture aberrations can be corrected up to the fifth order. The roles of these power supplies are described in detail later.

The control portion 19 executes a sequence of operations for correcting aberrations using loaded software, based on operations performed by the user, or operator, on the operation-and-display portion 9. Based on the results of these operations, the control portion 19 controls the power supplies 11–14, 17, and 21–24, thus controlling the electric and magnetic fields in the multipole elements 1–4 and objective lens 7.

This control portion 19 can be made of a computer, for example. Furthermore, the operation-and-display portion 9 can be integrated with the control portion. This integrated portion may be made of a personal computer having a console and a display unit, for example. Either the control portion 19 or the combination of the control portion 19 and operation-and-display portion 9 corresponds to the control means described above.

The multipole elements 1–4 can take any one of electrostatic, magnetic, and superimposed electric and magnetic field types if correction of chromatic aberration or correction of fifth-order aperture aberrations including skew multipole components is not taken into account. In the case of the magnetic field type, the multipole elements are controlled by electric currents supplied from the power supplies 21–24. In the case of the electrostatic field type, the elements are controlled by electric potentials applied from the power supplies 11–14. In the case of the superimposed field type using superimposed electric and magnetic fields, the elements are controlled by electric potentials and currents supplied from the power supplies 11–14 and 21–24.

Figure 2:
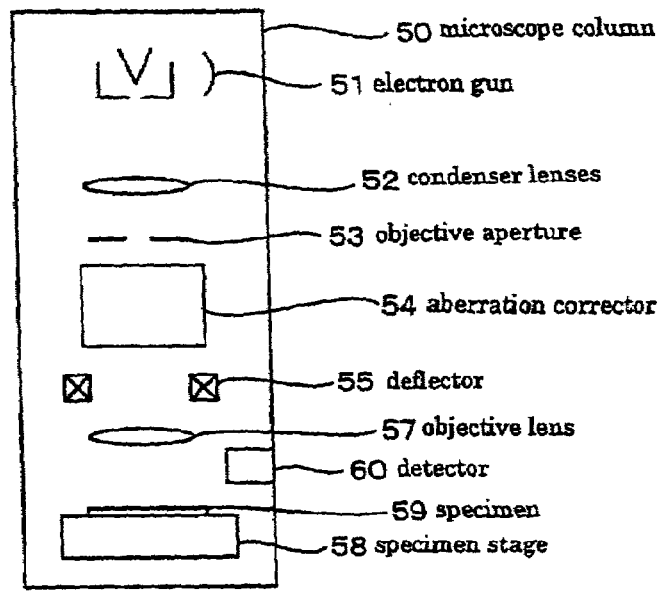
FIG. 2 is a diagram showing a scanning electron microscope incorporating an aberration corrector.

The four stages of multipole elements 1–4 and power supplies 11–14, 21–24 are hereinafter collectively referred to as the aberration corrector. Such an aberration corrector 10 is incorporated, for example, within a scanning electron microscope as shown in FIG. 2. In this case, electrons correspond to the charged particles.

The inside of a microscope column 50 is maintained as a vacuum environment. Mounted inside the microscope column 50 are an electron gun 51 for producing an electron beam and imparting energy to the electrons by an accelerating voltage, condenser lenses 52 and an objective aperture baffle 53 for focusing the beam produced by the gun 51 and limiting the beam current to an appropriate value, the aberration corrector 54 (corresponding to the aberration corrector 10 of FIG. 1), a deflector 55 for deflecting and scanning the beam in two dimensions across the specimen 59, an objective lens 57 for focusing the beam onto the specimen 59, a specimen stage 58 for holding the specimen 59 thereon and moving it at least within the X-Y plane, and a detector 60 for detecting signals such as secondary electrons produced from the specimen 59 as the specimen is illuminated and scanned with the electron beam.

Figure 3:
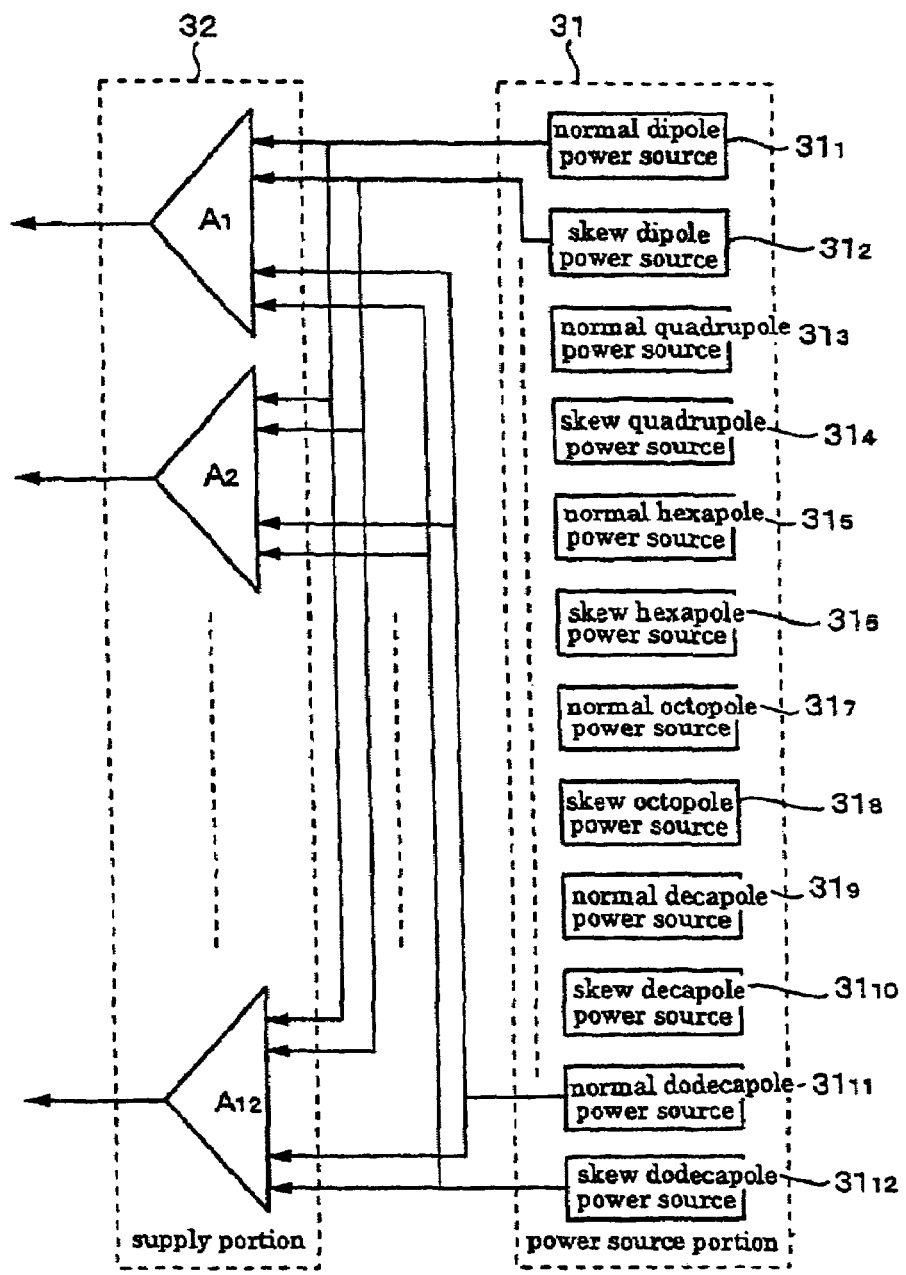
FIG. 3 is a diagram showing the structure of each power supply.

FIG. 3 shows the structure of each of the power supplies 11–14 used to excite the multipole elements according to the present embodiment. In the following description, electrostatic multipole elements are described. The principles set forth in the following description also apply to multipole elements of the superimposed electric and magnetic field type.

Each of these power supplies 11–14 has a power source portion 31 for producing electric potentials and a supply portion 32 for applying the electric potentials to the multipole elements 1–4 based on the operation of the power source portion 31.

The power source portion 31 has a normal dipole power source $31_1$, a skew dipole power source $31_2$, a normal quadrupole power source $31_3$, a skew quadrupole power source $31_4$, a normal hexapole power source $31_5$, a skew hexapole power source $31_6$, a normal octopole power source $31_7$, a skew octopole power source $31_8$, a normal decapole power source $31_9$, a skew decapole power source $31_{10}$, a normal dodecapole power source $31_{11}$, and a skew dodecapole power source $31_{12}$.

The supply portion 32 has 12 amplifiers $A_1$ to $A_{12}$ corresponding to the poles of every dodecapole element, respectively, of the multipole elements 1–4. These amplifiers $A_1$ to $A_{12}$ apply electric potentials to the 12 poles according to the electric potentials at the power sources $31_1$ to $31_{12}$ of the power source portion 31.

That is, based on the electric potentials at the power sources $31_1$ to $31_{12}$ of the power source portion 31, the electric potentials are added up by the amplifiers $A_1$ to $A_{12}$ and supplied. Consequently, aperture aberrations can be corrected up to the fifth order independently with the multipole element potentials, respectively. Where the multipole elements are of the magnetic field type, the system can be similarly constructed in a manner not illustrated.

The electric or magnetic potentials at the electrodes or magnetic pole pieces of the multipole elements 1–4 and electric potential distributions or magnetic potential distributions are next described.

Let r be the radius of each of the multipole elements 1–4 from the center. The optical axis is taken on the Z-axis. Let $\theta$ be the rotational angle from the X-axis around the Z-axis. The distributions of the electric potential and magnetic potential for generating the 2n-pole field at coordinate (r, $\theta$, z) are given by Electric potential for generating normal 2n-pole field:

$$\psi_{N2n}(r,\theta,z) = V_{N2n}\Psi_{2n}(z)(r/a)^n \cos(n\theta)$$

Electric potential for generating skew 2n-pole field:

$$\psi_{S2n}(r,\theta,z) = V_{S2n}\Psi_{2n}(z)(r/a)^n \sin(n\theta)$$

Magnetic potential for generating normal 2n-pole field:

$$\Phi_{N2n}(r,\theta,z) = \mu_0 I_{N2n}\phi_{2n}(z)(r/a)^n \sin(n\theta)$$

Magnetic potential for generating skew 2n-pole field:

$$\Phi_{S2n}(r,\theta,z) = -\mu_0 I_{S2n}\phi_{2n}(z)(r/a)^n \cos(n\theta)$$

In the above equations, $V_{N2n}$ and $V_{S2n}$ are electric potentials applied to the electrodes of the multipole element in order to generate a normal 2n-pole field and a skew 2n-pole field, respectively. $I_{N2n}$ and $I_{S2n}$ are coil currents (to be exact, the product of the numbers of turns and the currents, or ampere turn) through the magnetic pole pieces of the multipole element in order to generate a normal 2n-pole field and a skew 2n-pole field, respectively. $\Psi_{2n}(z)$ and $\phi_{2n}(z)$ are functions representing the electric potential and magnetic potential distributions, respectively, created by a 2n-pole field in the direction of the optical axis LO (Z-direction). And $\alpha$ is inner radius of the multipole, $\mu_0$ is permeability in the vacuum.

Where these are expressed by rectangular coordinates (x, y, z), the above equations are rewritten using $$x = r \cos \theta$$

$$y = r \sin \theta$$

In Tables 1–6 given below, the signs of the magnetic potentials for generating skew 2n-pole fields are inverted to reduce the number of tables, for ease of illustration. In actual calculations of aberrations, magnetic potentials are often taken as vector potentials. To make the description easier, scalar potentials are used herein.

Furthermore, synthesis of an electric or magnetic potential for generating a normal multipole field and an electric or magnetic potential for generating a skew multipole field corresponds to rotation of the multipole element. That is, where a normal multipole field is taken as a reference, the strength A of the normal multipole field and the strength B of the skew multipole field satisfy the relation $$A \cos \alpha + B \sin \alpha = C \cos(\alpha - \delta)$$

Since the relations, $A = C \cos \delta$ and $B = C \sin \delta$, hold, we have $$C = (A^2 + B^2)^{1/2}$$

$$\delta = \tan^{-1}(B/A)$$

In actual instrumentation, the synthesized strength C of the normal multipole field and the rotational angle $\delta$ from the normal position can be specified instead of specifying the strengths A and B. In the following description of the present embodiment, the strengths A and B are specified to clarify the relation of each electric potential to the actual electrode or the relation of each magnetic potential to the actual magnetic pole piece.

As a specific embodiment, a dodecapole element is adopted as the multipole elements 1–4. Where the amplitude of electric potential (or magnetic potential) is set to unit (=1), the values of electric potentials (or magnetic potentials) to be applied to the electrodes (or magnetic pole pieces) of the dodecapole element are listed in Tables 1–4.

Table 1 shows electric potentials for generating normal multipole fields and magnetic potentials for generating skew multipole fields, achieved by a dodecapole element in normal array.

TABLE 1

Electric potentials for generating normal multipole fields and magnetic potentials for generating skew multipole fields, achieved by a dodecapole element in normal array

| Pole No. | Angle from X-axis | | Dipole | Quadrupole | Hexapole | Octopole | Decapole | Dodecapole |
|---|---|---|---|---|---|---|---|---|
| n | $\theta$ [deg] | $\theta$ [rad] | $\cos(\theta)$ | $\cos(2\theta)$ | $\cos(3\theta)$ | $\cos(4\theta)$ | $\cos(5\theta)$ | $\cos(6\theta)$ |
| 1 | 0 | 0.0000 | 1.0000 | 1.0000 | 1.0000 | 1.0000 | 1.0000 | 1.0000 |
| 2 | 30 | 0.5236 | 0.8660 | 0.5000 | 0.0000 | −0.5000 | −0.8660 | −1.0000 |
| 3 | 60 | 1.0472 | 0.5000 | −0.5000 | −1.0000 | −0.5000 | 0.5000 | 1.0000 |
| 4 | 90 | 1.5708 | 0.0000 | −1.0000 | 0.0000 | 1.0000 | 0.0000 | −1.0000 |
| 5 | 120 | 2.0944 | −0.5000 | −0.5000 | 1.0000 | −0.5000 | −0.5000 | 1.0000 |

TABLE 1-continued

Electric potentials for generating normal multipole fields and magnetic potentials for generating skew multipole fields, achieved by a dodecapole element in normal array

| Pole No. | Angle from X-axis | | Dipole | Quadrupole | Hexapole | Octopole | Decapole | Dodecapole |
|---|---|---|---|---|---|---|---|---|
| n | θ [deg] | θ [rad] | cos (θ) | cos (2θ) | cos (3θ) | cos (4θ) | cos (5θ) | cos (6θ) |
| 6 | 150 | 2.6180 | −0.8660 | 0.5000 | 0.0000 | −0.5000 | 0.8660 | −1.0000 |
| 7 | 180 | 3.1416 | −1.0000 | 1.0000 | −1.0000 | 1.0000 | −1.0000 | 1.0000 |
| 8 | 210 | 3.6652 | −0.8660 | 0.5000 | 0.0000 | −0.5000 | 0.8660 | −1.0000 |
| 9 | 240 | 4.1888 | −0.5000 | −0.5000 | 1.0000 | −0.5000 | −0.5000 | 1.0000 |
| 10 | 270 | 4.7124 | 0.0000 | −1.0000 | 0.0000 | 1.0000 | 0.0000 | −1.0000 |
| 11 | 300 | 5.2360 | 0.5000 | −0.5000 | −1.0000 | −0.5000 | 0.5000 | 1.0000 |
| 12 | 330 | 5.7596 | 0.8660 | 0.5000 | 0.0000 | −0.5000 | −0.8660 | −1.0000 |

Table 2 shows electric potentials for generating skew multipole fields and magnetic potentials for generating normal multipole fields, achieved by a dodecapole element in normal array.

TABLE 2

Electric potentials for generating skew multipole fields and magnetic potentials for generating normal multipole fields, achieved by a dodecapole element in normal array

| Pole No. | Angle from X-axis | | Dipole | Quadrupole | Hexapole | Octopole | Decapole | Dodecapole sin (6θ) |
|---|---|---|---|---|---|---|---|---|
| n | θ [deg] | θ [rad] | sin (θ) | sin (2θ) | sin (3θ) | sin (4θ) | sin (5θ) | unrealizable |
| 1 | 0 | 0.0000 | 0.0000 | 0.0000 | 0.0000 | 0.0000 | 0.0000 | 0.0000 |
| 2 | 30 | 0.5236 | 0.5000 | 0.8660 | 1.0000 | 0.8660 | 0.5000 | 0.0000 |
| 3 | 60 | 1.0472 | 0.8660 | 0.8660 | 0.0000 | −0.8660 | −0.8660 | 0.0000 |
| 4 | 90 | 1.5708 | 1.0000 | 0.0000 | −1.0000 | 0.0000 | 1.0000 | 0.0000 |
| 5 | 120 | 2.0944 | 0.8660 | −0.8660 | 0.0000 | 0.8660 | −0.8660 | 0.0000 |
| 6 | 150 | 2.6180 | 0.5000 | −0.8660 | 1.0000 | −0.8660 | 0.5000 | 0.0000 |
| 7 | 180 | 3.1416 | 0.0000 | 0.0000 | 0.0000 | 0.0000 | 0.0000 | 0.0000 |
| 8 | 210 | 3.6652 | −0.5000 | 0.8660 | −1.0000 | 0.8660 | −0.5000 | 0.0000 |
| 9 | 240 | 4.1888 | −0.8660 | 0.8660 | 0.0000 | −0.8660 | 0.8660 | 0.0000 |
| 10 | 270 | 4.7124 | −1.0000 | 0.0000 | 1.0000 | 0.0000 | −1.0000 | 0.0000 |
| 11 | 300 | 5.2360 | −0.8660 | −0.8660 | 0.0000 | 0.8660 | 0.8660 | 0.0000 |
| 12 | 330 | 5.7596 | −0.5000 | −0.8660 | −1.0000 | −0.8660 | −0.5000 | 0.0000 |

Table 3 shows electric potentials for generating normal multipole fields and magnetic potentials for generating skew multipole fields, achieved by a dodecapole element in skew array. Where θ'=θ+15 [deg] or θ'=θ+π/12 [rad].

TABLE 3

Electric potentials for generating normal multipole fields and magnetic potentials for generating skew multipole fields, achieved by a dodecapole element in skew array

| Pole No. | Angle from X-axis | | Dipole | Quadrupole | Hexapole | Octopole | Decapole | Dodecapole cos (6θ') |
|---|---|---|---|---|---|---|---|---|
| n | θ + 15 [deg] | θ + π/12 [rad] | cos (θ') | cos (2θ') | cos (3θ') | cos (4θ') | cos (5θ') | unrealizable |
| 1 | 15 | 0.2618 | 0.9659 | 0.8660 | 0.7071 | 0.5000 | 0.2588 | 0.0000 |
| 2 | 45 | 0.7854 | 0.7071 | 0.0000 | −0.7071 | −1.0000 | −0.7071 | 0.0000 |
| 3 | 75 | 1.3090 | 0.2588 | −0.8660 | −0.7071 | 0.5000 | 0.9659 | 0.0000 |
| 4 | 105 | 1.8326 | −0.2588 | −0.8660 | 0.7071 | 0.5000 | −0.9659 | 0.0000 |
| 5 | 135 | 2.3562 | −0.7071 | 0.0000 | 0.7071 | −1.0000 | 0.7071 | 0.0000 |
| 6 | 165 | 2.8798 | −0.9659 | 0.8660 | −0.7071 | 0.5000 | −0.2588 | 0.0000 |
| 7 | 195 | 3.4034 | −0.9659 | 0.8660 | −0.7071 | 0.5000 | −0.2588 | 0.0000 |
| 8 | 225 | 3.9270 | −0.7071 | 0.0000 | 0.7071 | −1.0000 | 0.7071 | 0.0000 |

TABLE 3-continued

Electric potentials for generating normal multipole fields
and magnetic potentials for generating skew multipole fields,
achieved by a dodecapole element in skew array

| Pole | Angle from X-axis | | | | | | | Dodecapole |
|---|---|---|---|---|---|---|---|---|
| No. n | θ + 15 [deg] | θ + π/12 [rad] | Dipole cos (θ') | Quadrupole cos (2θ') | Hexapole cos (3θ') | Octopole cos (4θ') | Decapole cos (5θ') | cos (6θ') unrealizable |
| 9 | 255 | 4.4506 | −0.2588 | −0.8660 | 0.7071 | 0.5000 | −0.9659 | 0.0000 |
| 10 | 285 | 4.9742 | 0.2588 | −0.8660 | −0.7071 | 0.5000 | 0.9659 | 0.0000 |
| 11 | 315 | 5.4978 | 0.7071 | 0.0000 | −0.7071 | −1.0000 | −0.7071 | 0.0000 |
| 12 | 345 | 6.0214 | 0.9659 | 0.8660 | 0.7071 | 0.5000 | 0.2588 | 0.0000 |

Table 4 shows electric potentials for generating skew multipole fields and magnetic potentials for generating normal multipole fields, achieved by a dodecapole element in skew array.

TABLE 4

Electric potentials for generating skew multipole fields
and magnetic potentials for generating normal multipole
fields, achieved by a dodecapole element in skew array

| Pole | Angle from X-axis | | | | | | | |
|---|---|---|---|---|---|---|---|---|
| No. n | θ + 15 [deg] | θ + π/12 [rad] | Dipole sin (θ') | Quadrupole sin (2θ') | Hexapole sin (3θ') | Octopole sin (4θ') | Decapole sin (5θ') | Dodecapole sin (6θ') |
| 1 | 15 | 0.2618 | 0.2588 | 0.5000 | 0.7071 | 0.8660 | 0.9659 | 1.0000 |
| 2 | 45 | 0.7854 | 0.7071 | 1.0000 | 0.7071 | 0.0000 | −0.7071 | −1.0000 |
| 3 | 75 | 1.3090 | 0.9659 | 0.5000 | −0.7071 | −0.8660 | 0.2588 | 1.0000 |
| 4 | 105 | 1.8326 | 0.9659 | −0.5000 | −0.7071 | 0.8660 | 0.2588 | −1.0000 |
| 5 | 135 | 2.3562 | 0.7071 | −1.0000 | 0.7071 | 0.0000 | −0.7071 | 1.0000 |
| 6 | 165 | 2.8798 | 0.2588 | −0.5000 | 0.7071 | −0.8660 | 0.9659 | −1.0000 |
| 7 | 195 | 3.4034 | −0.2588 | 0.5000 | −0.7071 | 0.8660 | −0.9659 | 1.0000 |
| 8 | 225 | 3.9270 | −0.7071 | 1.0000 | −0.7071 | 0.0000 | 0.7071 | −1.0000 |
| 9 | 255 | 4.4506 | −0.9659 | 0.5000 | 0.7071 | −0.8660 | −0.2588 | 1.0000 |
| 10 | 285 | 4.9742 | −0.9659 | −0.5000 | 0.7071 | 0.8660 | −0.2588 | −1.0000 |
| 11 | 315 | 5.4978 | −0.7071 | −1.0000 | −0.7071 | 0.0000 | 0.7071 | 1.0000 |
| 12 | 345 | 6.0214 | −0.2588 | −0.5000 | −0.7071 | −0.8660 | −0.9659 | −1.0000 |

In Tables 3 and 4 achieved with dodecapole elements in skew array, the electric potentials or magnetic potentials have been normalized based on each potential at the first electrode or pole piece. The results are shown in Tables 5 and 6.

TABLE 5

Electric potentials for generating normal multipole fields and
magnetic potentials for generating skew multipole fields, achieved
by a dodecapole element in skew array, normalized with electric
or magnetic potentials at n = 1

| Pole | Angle from X-axis | | | | | | | Dodecapole |
|---|---|---|---|---|---|---|---|---|
| No. n | θ + 15 [deg] | θ + π/12 [rad] | Dipole cos (θ') | Quadrupole cos (2θ') | Hexapole cos (3θ') | Octopole cos (4θ') | Decapole cos (5θ') | cos (6θ') unrealizable |
| 1 | 15 | 0.262 | 1.0000 | 1.0000 | 1.0000 | 1.0000 | 1.0000 | |
| 2 | 45 | 0.785 | 0.7321 | 0.0000 | −1.0000 | −2.0000 | −2.7321 | |
| 3 | 75 | 1.309 | 0.2679 | −1.0000 | −1.0000 | 1.0000 | 3.7321 | |
| 4 | 105 | 1.833 | −0.2679 | −1.0000 | 1.0000 | 1.0000 | −3.7321 | |
| 5 | 135 | 2.356 | −0.7321 | 0.0000 | 1.0000 | −2.0000 | 2.7321 | |
| 6 | 165 | 2.880 | −1.0000 | 1.0000 | −1.0000 | 1.0000 | −1.0000 | |

TABLE 5-continued

Electric potentials for generating normal multipole fields and
magnetic potentials for generating skew multipole fields, achieved
by a dodecapole element in skew array, normalized with electric
or magnetic potentials at n = 1

| Pole | Angle from X-axis | | | | | | | Dodecapole |
|---|---|---|---|---|---|---|---|---|
| No. n | θ + 15 [deg] | θ + π/12 [rad] | Dipole cos (θ') | Quadrupole cos (2θ') | Hexapole cos (3θ') | Octopole cos (4θ') | Decapole cos (5θ') | cos (6θ') unrealizable |
| 7 | 195 | 3.403 | −1.0000 | 1.0000 | −1.0000 | 1.0000 | −1.0000 | |
| 8 | 225 | 3.927 | −0.7321 | 0.0000 | 1.0000 | −2.0000 | 2.7321 | |
| 9 | 255 | 4.451 | −0.2679 | −1.0000 | 1.0000 | 1.0000 | −3.7321 | |
| 10 | 285 | 4.974 | 0.2679 | −1.0000 | −1.0000 | 1.0000 | 3.7321 | |
| 11 | 315 | 5.498 | 0.7321 | 0.0000 | −1.0000 | −2.0000 | −2.7321 | |
| 12 | 345 | 6.021 | 1.0000 | 1.0000 | 1.0000 | 1.0000 | 1.0000 | |

TABLE 6

Electric potentials for generating skew multipole fields
and magnetic potentials for generating normal multipole fields,
achieved by a dodecapole element in skew array,
normalized with electric or magnetic potentials at n = 1

| Pole | Angle from X-axis | | | | | | | |
|---|---|---|---|---|---|---|---|---|
| No. n | θ + 15 [deg] | θ + π/12 [rad] | Dipole sin (θ') | Quadrupole sin (2θ') | Hexapole sin (3θ') | Octopole sin (4θ') | Decapole sin (5θ') | Dodecapole sin (6θ') |
| 1 | 15 | 0.262 | 1.0000 | 1.0000 | 1.0000 | 1.0000 | 1.0000 | 1.0000 |
| 2 | 45 | 0.785 | 2.7321 | 2.0000 | 1.0000 | 0.0000 | −0.7321 | −1.0000 |
| 3 | 75 | 1.309 | 3.7321 | 1.0000 | −1.0000 | −1.0000 | 0.2679 | 1.0000 |
| 4 | 105 | 1.833 | 3.7321 | −1.0000 | −1.0000 | 1.0000 | 0.2679 | −1.0000 |
| 5 | 135 | 2.356 | 2.7321 | −2.0000 | 1.0000 | 0.0000 | −0.7321 | 1.0000 |
| 6 | 165 | 2.880 | 1.0000 | −1.0000 | 1.0000 | −1.0000 | 1.0000 | −1.0000 |
| 7 | 195 | 3.403 | −1.0000 | 1.0000 | 1.0000 | 1.0000 | −1.0000 | 1.0000 |
| 8 | 225 | 3.927 | −2.7321 | 2.0000 | −1.0000 | 0.0000 | 0.7321 | −1.0000 |
| 9 | 255 | 4.451 | −3.7321 | 1.0000 | 1.0000 | −1.0000 | −0.2679 | 1.0000 |
| 10 | 285 | 4.974 | −3.7321 | −1.0000 | 1.0000 | 1.0000 | −0.2679 | −1.0000 |
| 11 | 315 | 5.498 | −2.7321 | −2.0000 | −1.0000 | 0.0000 | 0.7321 | 1.0000 |
| 12 | 345 | 6.021 | −1.0000 | −1.0000 | −1.0000 | −1.0000 | −1.0000 | −1.0000 |

Where each of the multipole elements 1–4 is made of a dodecapole (12-pole) element, the achievable dodecapole field is limited to either normal dodecapole field or skew dodecapole field, depending on whether the electrodes or magnetic pole pieces forming the dodecapole element are in a normal array or in a skew array. That is, in an unrealizable case, electric or magnetic potentials to be applied to the electrodes or magnetic pole pieces are zero.

The purpose of the present application is to eliminate the effects of hexapole components produced within the aberration corrector due to mechanical inaccuracy in a case where higher-order aperture aberrations are corrected and higher resolution should be achieved. One conceivable method of accomplishing this is to provide an aberration corrector in which four normal multipole fields produced by multipole elements and four skew multipole fields produced by multipole elements are combined as mentioned previously to set up eight multipole fields in total.

After investigating such apparatus, we have found that, if eight multipole fields are simply controlled independently, new problems occur. For example, when some aberration is corrected, plural solutions take place. With multipole elements that show a low sensitivity in correcting some aberration, an excessively high voltage must be applied for the correction. When such a high voltage is applied, new aberration is produced. In view of these fruitful results of the research, we have succeeded in avoiding occurrence of new problems as described above by reducing the number of multipole fields controlled independently as described in detail later. Also, the system is made easier to handle.

The principle of correction made by the aberration corrector 10 is hereinafter described. We have examined the corrective electric potentials (or corrective magnetic potentials or coil currents) of the aberration corrector 10, as well as X-direction and Y-direction aberration coefficients appearing on the specimen surface 20. As a result, we have found that the X-direction and Y-direction aberration corrections have relations to the increment ΔV of the corrective electric potential (or corrective magnetic potential). In particular, let $C_{nx}$ and $C_{my}$ be the nth and mth aberration coefficients, respectively, in the X- and Y-directions including a beam rotation effect, respectively. Let $\Delta C_{nx}$ and $\Delta C_{my}$ be the variations in the aberration coefficients $C_{nx}$ and $C_{my}$, respectively, when the corrective potential is varied by ΔV. The rates of change of the aberration coefficients are given by $$t_{nx} = \Delta C_{nx}/(C_{nx} \cdot \Delta V)$$

$$t_{mx} = \Delta C_{my}/(C_{mx} \cdot \Delta V)$$

We have found that there are interrelated numbers n and m in these relations. Although not described in detail, there is a proportional relation between $C_{nx}$ and $C_{my}$. This is now described briefly. Let $\alpha_x$ and $\alpha_y$ be the aperture angles of a beam incident on the specimen in the X- and Y-directions, respectively. The values of the angles $\alpha_x$ and $\alpha_y$ are so small that they can be approximated by $\sin \alpha_x$ and $\sin \alpha_y$, respectively (i.e., $\sin \alpha_x = \alpha_x$ and $\sin \alpha_y = \alpha_y$).

The concept is first described, taking the case of the third-order aperture aberration coefficients as an example, and using specific numerical values given in Table 7. This Table 7 lists the results of examination on the rates of change of the third-order aperture aberration coefficients (there are eight coefficients in the third order) when normal octopole and skew octopole fields are applied to the four stages of multipole elements and the fields are varied by given amounts. In this table, the left four columns indicate the X-direction, while the right four columns indicate the Y-direction. Each cell where the rate of change is zero within error tolerances is made empty for easy reading. Supplementarily speaking, the values of rates of change caused by skew octopole fields are relatively larger than the values of rates of change caused by normal octopole fields. This is due to the fact that the uncorrected aberration C in the denominator (C·ΔV) of rate of change arises from skew hexapole components which result in smaller aberration coefficients.

coefficients of the third-order terms $\alpha_x^1 \alpha_y^2$ of the first through fourth skew stages in the Y-direction within error tolerances. This is the first finding.

Then, the rates of change of the coefficients of the first through fourth normal stages are compared. The comparisons are performed in terms of absolute values. It is first seen that the rate of change of the aberration coefficient of the second stage term $\alpha_x^3 \alpha_y^0$ and the rate of change of the aberration coefficient of the third stage term $\alpha_x^0 \alpha_y^3$ are greater than the rates of change of the other coefficients. That is, the second and third normal stages exert greater influences on the increment of the octopole field than the first and fourth normal stages when this field is varied. Comparison between the first and fourth stages reveals that they are approximately identical. This is the second finding.

Similarly, the rates of change of the coefficients occurring when the electric potentials for generating the skew octopole fields are applied to the first through fourth stages of multipole elements are compared. The comparisons are made also in terms of absolute values. It is apparent that the numerical values of the first and fourth stages are greater than the numerical values of the second and third stages. This is the third finding.

These findings are applied when multipole elements to which octopole fields are to be applied are selected. The

TABLE 7

| | Rate of change ΔC/(C · ΔV) | | | | | | | |
|---|---|---|---|---|---|---|---|---|
| | C49x $\alpha_x^3$ | C51x $\alpha_x^2\alpha_y$ | C58x $\alpha_x\alpha_y^2$ | C74x $\alpha_y^3$ | C49y $\alpha_x^3$ | C51y $\alpha_x^2\alpha_y$ | C58y $\alpha_x\alpha_y^2$ | C74y $\alpha_y^3$ |
| Normal 1st stage | −1.87E−02 | | 5.84E−02 | | | 5.84E−02 | | −6.37E−03 |
| Normal 2nd stage | −1.68E−01 | | 8.37E−03 | | | 8.37E−03 | | −2.72E−05 |
| Normal 3rd stage | −2.72E−05 | | 8.37E−03 | | | 8.37E−03 | | −1.68E−01 |
| Normal 4th stage | −6.38E−03 | | 5.84E−02 | | | 5.84E−02 | | −1.87E−02 |
| Skew 1st stage | | −3.31E+01 | | 2.60E+01 | −3.31E+01 | | 2.60E+1 | |
| Skew 2nd stage | | 1.95E+00 | | −1.67E−02 | 1.95E+00 | | −1.67E−02 | |
| Skew 3rd stage | | 1.26E−02 | | −2.59E+00 | 1.26E−02 | | −2.59E+00 | |
| Skew 4th stage | | −1.96E+01 | | 4.40E+01 | −1.96E+01 | | 4.40E+01 | |

This table is now discussed in detail. It can be seen that the rates of change of the four aberration coefficients of the third-order terms $\alpha_x^2 \alpha_y^1$ of the first through fourth skew stages producing X-direction skew octopole fields are coincident with the rates of change of the four aberration coefficients of first through fourth skew stages of the third-order terms $\alpha_x^3 \alpha_y^0$ due to the Y-direction first through fourth skew stages within error tolerances. Similarly, the rates of change of the four aberration coefficients of the third-order terms $\alpha_x^1 \alpha_y^2$ of the first through fourth normal stages producing X-direction normal octopole fields are coincident with the rates of change of the four aberration coefficients of the third-order terms $\alpha_x^2 \alpha_y^1$ of the first through fourth normal stages in the Y-direction within error tolerances. The rates of change of the four aberration coefficients of the third-order terms $\alpha_x^0 \alpha_y^3$ of the first through fourth skew stages producing X-direction skew octopole fields are coincident with the rates of change of the four aberration foregoing relates to the case of the third-order aperture aberration coefficients. Also, with respect to the other higher orders (second, fourth, and fifth orders), similar three findings are obtained in these cases although not described in detail. Accordingly, a similar method can be used to select multipole elements producing multipole fields (i.e., hexapole, decapole, and dodecapole fields) in the cases of other high orders. The cases of the aperture aberration coefficients of the second through fifth orders are described below based on the above-described concept.

The following theory applies in the case of the second-order aperture aberration coefficients. Some of the Y-direction aberration terms have a dependent relation to the X-direction aberration terms. These two kinds of terms are juxtaposed vertically below. That is to say, the Y-direction aberration term just under an X-direction aberration term shows itself having a linearly dependant relation to the X-direction aberration term. This is based on the first finding described above. The same theory applies in the cases of the third and higher orders.

X-direction: $\alpha_x^2 \alpha_y^0, \alpha_x^1 \alpha_y^1, \alpha_x^0 \alpha_y^2$
Y-direction: $\alpha_x^2 \alpha_y^0, \alpha_x^1 \alpha_y^1, \alpha_x^0 \alpha_y^2$ The rates of change of aberrations proportional to these terms are herein given by X-direction: $t_{1x}, t_{2x}, t_{3x}$
Y-direction: $t_{1y}, t_{2y}, t_{3y}$ From the first finding about the second-order aperture aberration coefficients, we have $t_{2x}=t_{1y}, t_{3x}=t_{2y}$ Accordingly, there are four independent parameters. At least four independent power supplies are necessary.

The following theory applies in the case of the third-order aperture aberration coefficients.

X-direction: $\alpha_x^3 \alpha_y^0, \alpha_x^2 \alpha_y^1, \alpha_x^1 \alpha_y^2, \alpha_x^0 \alpha_y^3$
Y-direction: $\alpha_x^3 \alpha_y^0, \alpha_x^2 \alpha_y^1, \alpha_x^1 \alpha_y^2, \alpha_x^0 \alpha_y^3$ The rates of changes of the aberrations proportional to these terms are herein given by X-direction: $t_{1x}, t_{2x}, t_{3x}, t_{4x}$
Y-direction: $t_{1y}, t_{2y}, t_{3y}, t_{4y}$ Thus, we have the relationships:

$t_{2x}=t_{1y}, t_{3x}=t_{2y}, t_{4x}=t_{3y}$

Therefore, there are five independent parameters, and thus at least five independent power supplies are necessary.

The following terms are used in the case of the fourth-order aperture aberration coefficients:

X-direction: $\alpha_x^4 \alpha_y^0, \alpha_x^3 \alpha_y^1, \alpha_x^2 \alpha_y^2, \alpha_x^1 \alpha_y^3, \alpha_x^0 \alpha_y^4$
Y-direction: $\alpha_x^4 \alpha_y^0, \alpha_x^3 \alpha_y^1, \alpha_x^2 \alpha_y^2, \alpha_x^1 \alpha_y^3, \alpha_x^0 \alpha_y^4$ The rates of change of the aberration coefficients proportional to these terms are herein given by X-direction: $t_{1x}, t_{2x}, t_{3x}, t_{4x}, t_{5x}$
Y-direction: $t_{1y}, t_{2y}, t_{3y}, t_{4y}, t_{5y}$ Then, we have $t_{2x}=t_{1y}, t_{3x}=t_{2y}, t_{4x}=t_{3y}, t_{5x}=t_{4y}$ Consequently, there are six independent parameters. At least six independent power supplies are necessary. The terns associated with the fifth-order aperture aberration coefficients are given by X-direction: $\alpha_x^5 \alpha_y^0, \alpha_x^4 \alpha_y^1, \alpha_x^3 \alpha_y^2, \alpha_x^2 \alpha_y^3, \alpha_x^1 \alpha_y^4, \alpha_x^0 \alpha_y^5$
Y-direction: $\alpha_x^5 \alpha_y^0, \alpha_x^4 \alpha_y^1, \alpha_x^3 \alpha_y^2, \alpha_x^2 \alpha_y^3, \alpha_x^1 \alpha_y^4, \alpha_x^0 \alpha_y^5$ The rates of change of the aberration coefficients proportional to these terms are herein given by X-direction: $t_{1x}, t_{2x}, t_{3x}, t_{4x}, t_{5x}, t_{6x}$
Y-direction: $t_{1y}, t_{2y}, t_{3y}, t_{4y}, t_{5y}, t_{6y}$ We have $t_{2x}=t_{1y}, t_{3x}=t_{2y}, t_{4x}=t_{3y}, t_{5x}=t_{4y}, t_{6x}=t_{5y}$ Consequently, there are seven independent parameters. Hence, at least seven independent power supplies are needed.

The relations between the aberration coefficients found by us have been described so far. Aberrations appear differently between normal multipole fields and skew multipole fields. Therefore, a method of making corrections while paying attention to what aberration coefficients is described in the under-described actual corrective procedure. What multipole elements are selected at this time depends on the second and third findings.

Actual corrective procedure adopted in the aberration corrector 10 is next described. In the following description, it is assumed that focus adjustment, chromatic aberration correction, and correction of second-order aperture aberrations have been completed. Let $\alpha_x$ and $\alpha_y$ be the aperture angles of a beam of charged particles incident on a specimen surface, taken in the X- and Y-directions, respectively, with respect to the optical axis LO of the beam.

FIGS. 4(A)–4(C) illustrate correction of aberrations using the multipole elements 1–4. First, spherical aberration (third-order aperture aberrations) is described by referring to FIG. 4(A).

In the case of the correction of spherical aberration (third-order aperture aberrations), the number of independent parameters as described above can be reduced to five. Therefore, five multipole fields can be selected from eight multipole fields consisting of the four stages of normal multipole fields and the four stages of skew multipole fields. The selection is so made that the beam position is affected greatly when the electric or magnetic potential of the octopole field applied to the multipole elements varies. Our research results have shown that the second and third stages of normal multipole fields exert greater influences and are important. With respect to the first and fourth stages of normal multipole fields, at least one may be selected. Therefore, in this embodiment, the normal multiple fields in the first, second and third stages are selected as shown in FIG. 4(A). With respect to the skew multipole fields, the second and third stages exert less influences and so it is not desirable to select them. In consequence, the skew multipole fields in the first and fourth stages are selected.

In the following description, it is assumed that the objective lens 7 is of the magnetic field type. Alternatively, at least one magnetic lens for focusing the beam may be inserted in the optical system. In this case, the magnetic field rotates the beam. Therefore, with respect to the effects of the correction made by the aberration corrector 10, the effects of the corrections made by the normal and skew multipole fields cannot be discriminated from each other unless the amount corresponding to the rotation is not corrected. For this reason, the normal and skew multipole fields are controlled not independently but interrelatedly.

With respect to the corrective potentials of the octopoles that are not yet corrected, potentials $V_1$, $V_2$, and $V_3$ are applied to the first, second, and third stages of multipole elements 1, 2, and 3, respectively, such that they serve as normal octopoles. Electric potentials $V_4$ and $V_5$ are applied to the first and fourth stages of multipole elements 1 and 4, respectively, such that they act as skew octopoles. With respect to the uncorrected aberration coefficients on the specimen surface 20 regarding the corrective potentials, let $c_1$, $c_4$, $c_2$, and $c_5$ be the coefficients of the aberration proportional to $\alpha_x^3$, $\alpha_x^2 \alpha_y$, $\alpha_x \alpha_y^2$, and $\alpha_y^3$ affecting the position in the X-direction. Let $c_3$ be the coefficient of the aberration proportional to $\alpha_y^3$ affecting the position in the Y-direction. Here the coefficients $c_4$, $c_2$, and $c_5$ are also proportional to the aberration coefficients of $\alpha_x^3$, $\alpha_x^2 \alpha_y$, and $\alpha_x \alpha_y^2$ affecting the position in Y-direction, respectively.

Then, let $\Delta V_1$, $\Delta V_2$, and $\Delta V_3$ be the variations in the electric potentials at the first, second, and third stages of normal octopole fields, respectively. Let $\Delta V_4$ and $\Delta V_5$ be the variations in the electric potentials at the first and fourth stages of skew octopole fields, respectively.

It is to be noted that when the variations $\Delta V_k$ (k=1 to 5) are produced, the aberration coefficients $c_j$ (j=1 to 5) are varied. However, the aberration coefficients of the normal multipole fields do not vary independently of the coefficients of the skew multipole fields. The variation of each aberration coefficient $c_j$ is given by $$\Delta c_j = \sum_{k=1}^{5} \frac{\partial c_j}{\partial V_k} \Delta V_k \equiv \sum_{k=1}^{5} a_{jk} \Delta V_k \quad (1)$$

The variation $\Delta V_k$, or increment, for making the aberration coefficient $c_j$ zero is found by solving the simultaneous equations $$[a_{jk}][\Delta V_k]=[-c_j]$$

where $[a_{jk}]$ is a matrix of j rows and k columns, $[\Delta V_k]$ is a column vector of the kth row, and $[-c_j]$ is the column vector of the jth row.

As a result, for k=1 to 5, the corrective potential is given by $$V_k + \Delta V_k$$

In this way, the uncorrected aberration coefficient $c_j$ can be canceled out by an aberration coefficient $-c_j$ produced by the aberration corrector 10.

The case where the objective lens 7 is of the electrostatic type (or a magnetic lens for focusing the beam is not contained in the optical system) is next described. In this case, with respect to the effects of the correction made by the aberration corrector, the effects of the normal multipole fields are independent of the effects of the skew multipole fields. Accordingly, with respect to the present, uncorrected octopole corrective potentials, electric potentials $V_1$, $V_2$, and $V_3$ are applied to the first, second, and third stages of multipole elements 1, 2, and 3, respectively, such that they act as normal octopole elements. Electric potentials $V_4$ and $V_5$ are applied to the first and fourth stages of multipole elements 1 and 4, respectively, such that they act as skew octopole elements. The normal multipole fields are controlled independently of the skew multipole fields. With respect to the present aberration coefficients on the specimen surface for these corrective potentials, let $c_1$, $c_4$, $c_2$, and $c_5$ be the coefficients of the aberration proportional to $\alpha_x^3$, $\alpha_x^2\alpha_y$, $\alpha_x\alpha_y^2$, and $\alpha_y^3$, respectively, which affect the position in the X-direction. Let $c_3$ be the coefficient of the aberration proportional to $\alpha_y^3$ affecting the position in the Y-direction. Here the coefficients $c_4$, $c_2$, and $c_5$ are also proportional to the aberration coefficients of $\alpha_x^3$, $\alpha_x^2\alpha_y$, and $\alpha_x\alpha_y^2$ affecting the position in Y-direction, respectively.

Let $\Delta V_1$, $\Delta V_2$, and $\Delta V_3$ be the increments of the electric potentials at the normal octopole fields in the first, second, and third stages, respectively. Let $\Delta V_4$ and $\Delta V_5$ be increments of the electric potentials at the skew octopole fields in the first and fourth stages, respectively.

When each increment $\Delta V_k$ (k=1 to 5) occurs, the aberration coefficient $c_j$ (j=1 to 5) varies. The aberration coefficients of the normal multipole fields vary independently of the aberration coefficients of the skew multipole fields. That is, the increment of the aberration coefficient of each normal multipole field (j, k=1 to 3) is given by $$\Delta c_j = \sum_{k=1}^{3} \frac{\partial c_j}{\partial V_k} \Delta V_k \equiv \sum_{k=1}^{3} a_{jk} \Delta V_k \quad (2)$$

The increment of the aberration coefficient of each skew multipole field (j, k=4 to 5) is given by $$\Delta c_j = \sum_{k=4}^{5} \frac{\partial c_j}{\partial V_k} \Delta V_k \equiv \sum_{k=4}^{5} a_{jk} \Delta V_k \quad (3)$$

Therefore, the increment $\Delta V_k$ that makes the aberration coefficient $c_j$ zero is found by solving the simultaneous equations normal multipole fields (j, k=1 to 3): $[a_{jk}][\Delta V_k]=[-c_j]$ skew multipole fields (j, k=4 to 5): $[a_{jk}][\Delta V_k]=[-c_j]$ As a result, for k=1 to 5, the corrective potential is given by $$V_k + \Delta V_k$$

In this way, the uncorrected aberration coefficient $c_j$ can be canceled out by an aberration coefficient $-c_j$ produced by the aberration corrector 10.

Where the second-order aperture aberrations have been corrected, if the aberration correction potentials obtained as described above are set for the respective multipole elements, five third-order aperture aberration coefficients $c_j$ appearing in the calculation can be canceled to zero, the five coefficients being contained in the eight third-order coefficients. In addition, it can be confirmed that the other three third-order aperture aberration coefficients which do not appear in the calculation become substantially null at the same time. That is, the number of independent electric potentials necessary for correction of the third-order aperture aberrations is three for normal octopole fields and is two for skew octopole fields. Thus, it can be seen that the object can be achieved by five octopole fields in total.

The combination of the multipole fields selected to provide different aberration coefficients and electric potentials as described above is so determined that greater aberration coefficient variations are produced when the electric potentials are varied slightly. In actual corrections, if it is difficult to precisely measure the various aberration coefficients or corresponding amounts of blur from images, the direction in which blur of images is large for each potential increment $\Delta V_k$ described above is noted. Each $V_k$ is repetitively adjusted such that the image blur in this direction is minimized. Even if the system needs aberration corrections using the electric potentials at skew hexapole fields after the repetitive adjusting operations, the third-order aperture aberrations can all be made zero. Where blur is observed or measured, if the focal position is slightly shifted from the specimen surface as is well known in the art, the variations of the blur on the viewing screen can be seen more easily. Therefore, this procedure may be utilized.

Then, non-independently variable power supplies other than the independently variable power supplies that can apply independently variable electric or magnetic potentials are supplementarily described. In the description already provided in connection with FIG. 4(A), it is assumed that the electric or magnetic potentials at the unused, remaining fourth stage of normal octopole fields and the second and third stages of skew octopole fields are null. Instead of this, certain octopole field electric or magnetic potential may be applied. Alternatively, these potentials may be varied in a dependent manner and at a constant ratio on the other independently variable octopole fields. The advantage of this scheme is that the electric or magnetic potentials added up for corrections of from lower to higher orders and finally applied to the multipole elements may be prevented from assuming excessively large values. For example, the electric or magnetic potentials that are applied may be assigned to plural stages to prevent the electric or magnetic potential at any one octopole field or element from getting too large. In this meaning, applying nonzero, constant octopole electric or magnetic potential or making the potentials vary in a dependent and interlocking manner on the other independently variable octopole fields often produces merits in practical applications. As a modification of this dependent and interlocking scheme, if the number of the independent power supplies is increased to more than the above-described five, advantages may be produced.

Some stages of octopole fields should not be applied with electric or magnetic potential (see Table 7). For example, if a large electric or magnetic potential is applied to the second and third stages of skew octopole fields, the third-order aperture aberrations produced by hexapole components can be corrected only a little by hexapole components. Therefore, if complete correction is attempted in these stages, higher-order aberrations will increase drastically. Accordingly, where the power supply stability or noise presents no problems, stages (sensitive stages) which show greater aberration coefficient variations when the electric or magnetic potential is varied by a given amount are selected. For this reason, the first and fourth stages are used as the skew multipole elements as described above.

Further discussion made in this way reveals that the second and third stages of the normal octopole fields to which the above-described three electric potentials should be applied independently produce larger rates of change and are important (see Table 7). With respect to the third field to which an electric potential should be applied independently, this third field may be the first stage as mentioned previously. However, it has been theoretically and empirically demonstrated that if the third field is set to the fourth stage or if the first and fourth stages are placed at the same electric potential, no practical problems take place. If the first stage is considered as an independent field, placing the first and fourth stages at the same electric potential as described above means that the fourth stage is made to depend on the first stage in a 1:1 relation.

How the number of independent power supplies is selected has been described so far. Also, what multipole fields of the first through fourth stages of multipole elements 1–4 should be used independently have been described. The same theories can be applied to the corrections of the fourth-order and fifth-order aperture aberrations as described below.

The correction of the fourth-order aperture aberrations is now described by referring to FIG. 4(B). In the case of the correction of the fourth-order aperture aberrations, the number of independent parameters can be reduced up to six as mentioned previously. Therefore, six fields may be selected from the eight multipole fields consisting of four stages of normal multipole fields and four stages of skew multipole fields. Similarly to the description of the spherical aberration (third-order aperture aberrations), multipole fields are selected such that the beam position is affected to a greater extent when the electric or magnetic potential applied to the selected multipole fields is varied by a given amount. Although not described in detail, our research results indicate that the first, second, and fourth stages of normal multipole fields are selected and the first, third, and fourth stages of skew multipole fields are selected as shown in FIG. 4(B).

First, a system in which the objective lens 7 is of the magnetic field type in the same way as in the aforementioned case of spherical aberration (third-order aperture aberrations) is described.

With respect to the uncorrected corrective electric potential for the decapole field, electric potentials $V_1$, $V_2$, and $V_3$ are applied to the first, second, and fourth stages of multipole elements 1, 2, 4, respectively, such that they act as normal decapole fields. Electric potentials $V_4$, $V_5$, and $V_6$ are applied to the first, third, and fourth stages of multipole elements 1, 3, and 4 such that they serve as skew decapole fields. With respect to the uncorrected aberration corrections on the specimen surface regarding the corrective potentials, let $c_1$, $c_4$, $c_2$, $c_5$, and $c_3$ be the coefficients of the aberration proportional to $\alpha_x^4$, $\alpha_x^3\alpha_y$, $\alpha_x^2\alpha_y^2$, $\alpha_x\alpha_y^3$, and $\alpha_y^4$ affecting the position in the X-direction. Let $c_6$ be the coefficient of the aberration proportional to $\alpha_y^4$ affecting the position in the Y-direction. Here the coefficients $c_4$, $c_2$, $c_5$, and $c_3$ are also proportional to the aberration coefficients of $\alpha_x^4$, $\alpha_x^3\alpha_y$, $\alpha_x^2\alpha_y^2$, and $\alpha_x\alpha_y^3$ affecting the position in Y-direction, respectively.

Then, let $\Delta V_1$, $\Delta V_2$, and $\Delta V_3$ be the variations in the electric potentials at the first, second, and third normal decapole fields, respectively. Let $\Delta V_4$, $\Delta V_5$, and $\Delta V_6$ be the variations in the electric potentials at the first, third, and fourth stages of skew decapole fields, respectively.

Variations in the aberration coefficients $c_j$ (j=1 to 6) of the normal multipole fields when each $\Delta V_k$ (k=1 to 6) is varied are not independent of variations in the aberration coefficients $c_j$ of the skew multipole fields. Rather, they are interrelated and given by $$\Delta c_j = \sum_{k=1}^{6} \frac{\partial c_j}{\partial V_k} \Delta V_k \equiv \sum_{k=1}^{6} a_{jk} \Delta V_k \tag{4}$$

The variation $\Delta V_k$, or increment, that makes the aberration coefficient $c_j$ zero is found by solving the simultaneous equations $$[a_{jk}][\Delta V_k] = [-c_j]$$

As a result, for k=1 to 6, the corrective potential is given by $$V_k + \Delta V_k$$

In this way, the uncorrected aberration coefficient $c_j$ can be canceled out by an aberration coefficient $-c_j$ produced by the aberration corrector 10.

A system in which the objective lens 7 is of the electrostatic type in the same way as in the above-described case of spherical aberration (third-order aperture aberrations) is next described. First, with respect to the uncorrected decapole corrective potentials, electric potentials $V_1$, $V_2$, and V3 are applied to the first, second, and fourth stages of multipole elements, respectively, such that they act as normal decapole fields. Electric potentials $V_4$, $V_5$, and $V_6$ are applied to the first, third, and fourth stages of multipole elements, respectively, such that they act as skew decapole fields. With respect to the uncorrected aberration coefficients on the specimen surface for these corrective potentials, let $c_1$, $c_4$, $c_2$, $c_5$, and $c_3$ be the coefficients of the aberration proportional to $\alpha_x^4$, $\alpha_x^3\alpha_y$, $\alpha_x^2\alpha_y^2$, $\alpha_x\alpha_y^3$, and $\alpha_y^4$, respectively, which affect the position in the X-direction. Let $c_6$ be the aberration coefficient proportional to $\alpha_y^4$ affecting the position in the Y-direction. Here the coefficients $c_4$, $c_2$, $c_5$, and $c_3$ are also proportional to the aberration coefficients of $\alpha_x^4$, $\alpha_x^3 \alpha_y$, $\alpha_x^2 \alpha_y^2$, and $\alpha_x \alpha_y^3$ affecting the position in Y-direction, respectively.

Let $\Delta V_1$, $\Delta V_2$, and $\Delta V_3$ be the increments of the electric potentials at the normal decapole fields in the first, second, and fourth stages, respectively. Let $\Delta V_4$, $\Delta V_5$, and $\Delta V_6$ be increments of the electric potentials at the skew decapole fields in the first, third, and fourth stages, respectively.

When each increment $\Delta V_k$ (k=1 to 6) occurs, the aberration coefficient $c_j$ (j=1 to 6) varies. The aberration coefficients of the normal multipole fields vary independently of the aberration coefficients of the skew multipole fields. That is, the increment of the aberration coefficient of each normal multipole field (j, k=1 to 3) is given by $$\Delta c_j = \sum_{k=1}^{3} \frac{\partial c_j}{\partial V_k} \Delta V_k \equiv \sum_{k=1}^{3} a_{jk} \Delta V_k \quad (5)$$

The increment of the aberration coefficient of each skew multipole field (j, k=4 to 6) is given by $$\Delta c_j = \sum_{k=4}^{6} \frac{\partial c_j}{\partial V_k} \Delta V_k \equiv \sum_{k=4}^{6} a_{jk} \Delta V_k \quad (6)$$

Therefore, the increment $\Delta V_k$ that makes the aberration coefficient $c_j$ zero is found by solving the simultaneous equations normal multipole fields (j, k=1 to 3): $[a_{jk}][\Delta V_k]=[-c_j]$ skew multipole fields (j, k=4 to 6): $[a_{jk}][\Delta V_k]=[-c_j]$ As a result, for k=1 to 6, the corrective potential is given by $V_k+\Delta V_k$ In this way, the uncorrected aberration coefficient $c_j$ can be canceled out by an aberration coefficient $-c_j$ produced by the aberration corrector 10.

Where the third-order and lower-order aperture aberrations have been corrected, if the aberration-correcting potentials obtained as described above are set for the respective multipole elements, six fourth-order aberration coefficients $c_j$ (j=1 to 6) appearing in the calculation can be canceled to zero. It can also be confirmed that the other four fourth-order aperture aberration coefficients which do not appear in the calculation become substantially null at the same time. That is, the number of independent electric potentials necessary for correction of the fourth-order aperture aberrations is three for normal decapole fields and is three for skew decapole fields. Thus, it can be seen that the object can be achieved by six decapole fields in total.

The combination of the multipole fields selected to provide different aberration coefficients and electric potentials as described above is so determined that greater aberration coefficient variations are produced when the electric potentials are varied slightly. Especially, with normal decapole fields, the second stage of multipole element produces a greater rate of change. With skew decapole fields, the third stage of multipole element produces a greater rate of change. Therefore, at least these two fields should be contained. In actual corrections, if it is difficult to precisely measure the various aberration coefficients or corresponding amounts of blur from images, the direction in which blur of images is large for each potential increment $\Delta V_k$ described above is noted. Each $V_k$ is repetitively adjusted such that the image blur in this direction is minimized. Even if the system needs aberration corrections using skew hexapole electric potentials after the repetitive adjusting operations, the fourth-order aperture aberrations can all be made zero.

The correction of the fifth-order aperture aberrations is now described by referring to FIG. 4(C) and FIG. 1. In the case of the correction of the fifth-order aperture aberrations, the number of independent parameters can be reduced up to seven as mentioned previously. Therefore, seven fields may be selected from the eight multipole fields consisting of four stages of normal multipole fields and four stages of skew multipole fields. Similarly to the description of spherical aberration (third-order aperture aberrations), multipole fields are selected such that the beam position is affected to a greater extent when the electric or magnetic potential applied to the selected multipole elements is varied by a given amount. Although not described in detail, our research results indicate that all the four stages of normal multipole fields are selected and the first, second, and fourth stages of skew multipole fields excluding the third stage are selected as shown in FIG. 4(C).

First, a system in which the objective lens 7 is of the magnetic field type is described. Where a dodecapole element having a normal array in terms of electric potentials is used as a multipole element, in order to correct the fifth-order aperture aberrations in a system containing skew hexapole components, it is necessary that the first and fourth stages be also of the superimposed electric and magnetic field type and that power supplies 21, 24 for the multipole coils for the first and fourth stages be mounted (see FIG. 1).

To make this correction, with respect to the uncorrected corrective potentials at the dodecapole element, electric potentials $V_1$, $V_2$, $V_3$, and $V_4$ are applied to the first, second, third, and fourth stages of multipole elements such as they act normal dodecapole fields. Magnetic potentials corresponding to electric potentials $V_5$, $V_6$, and $V_7$ are applied to the first, second, and fourth stages of multipole elements such that they act as skew dodecapole fields. With respect to the uncorrected aberration coefficients on the specimen surface regarding the corrective electric potentials, let $c_1$, $c_5$, $c_2$, $c_6$, $c_3$, and $c_7$ be the coefficients of the aberration proportional to $\alpha_x^5$, $\alpha_x^4 \alpha_y$, $\alpha_x^3 \alpha_y^2$, $\alpha_x^2 \alpha_y^3$, $\alpha_x \alpha_y^4$, and $\alpha_y^5$, affecting the position in the X-direction. Let $c_4$ be the coefficient of the aberration proportional to $\alpha_y^5$ affecting the position in the Y-direction. Here the coefficients $c_5$, $c_2$, $c_6$, $c_3$, and $c_7$ are also proportional to the aberration coefficients $a_x^5$, $\alpha_x^4 \alpha_y$, $\alpha_x^3 \alpha_y^2$, $\alpha_x^2 \alpha_y^3$, and $\alpha_x \alpha_y^4$ affecting the position in Y-direction, respectively.

Then, let $\Delta V_1$, $\Delta V_2$, $\Delta V_3$, and $\Delta V_4$ be the variations in the electric potentials at the first, second, third, and fourth stages of normal dodecapole fields, respectively. Let $\Delta V_5$, $\Delta V_6$, and $\Delta V_7$ be the variations in the electric potentials at the first, second, and fourth stages of skew dodecapole fields, respectively.

When each $\Delta V_k$ (k=1 to 7) is varied, the aberration coefficients $c_j$ (j=1 to 7) of the normal multipole fields vary not independently of the aberration coefficients $c_j$ of the skew multipole fields. Rather, they are interrelated and given by $$\Delta c_j = \sum_{k=1}^{7} \frac{\partial c_j}{\partial V_k} \Delta V_k \equiv \sum_{k=1}^{7} a_{jk} \Delta V_k \qquad (7)$$

The variation $\Delta V_k$, or increment, that makes the aberration coefficient $c_j$ zero is found by solving the simultaneous equations $$[a_{jk}][\Delta V_k] = [-c_j]$$

As a result, for k=1 to 7, the corrective electric potential is given by $$V_k + \Delta V_k$$

In this way, the uncorrected aberration coefficient $c_j$ can be canceled out by an aberration coefficient $-c_j$ produced by the aberration corrector 10.

Where each of the multipole elements 1–4 for realizing the skew dodecapole elements has more than 12 poles, the dodecapole elements can be achieved only with electric potentials without making use of magnetic potentials.

A system in which the objective lens 7 is of the electrostatic type is next described. Electric potentials $V_1$, $V_2$, $V_3$, and $V_4$ are applied to the first, second, third, and fourth stages of multipole elements, respectively, such that they act as normal dodecapole fields. Magnetic potentials corresponding to electric potentials $V_5$, $V_6$, and $V_7$ are applied to the first, second, and fourth stages of multipole elements, respectively, such that they act as skew dodecapole fields. With respect to the present aberration coefficients on the specimen surface for these corrective electric potentials, let $c_1$, $c_5$, $c_2$, $c_6$, $c_3$, and $c_7$ be the coefficients of the aberration proportional to $\alpha_x^5$, $\alpha_x^4 \alpha_y$, $\alpha_x^3 \alpha_y^2$, $\alpha_x^2 \alpha_y^3$, $\alpha_x \alpha_y^4$, and $\alpha_y^5$, respectively, which affect the position in the X-direction. Let $c_4$ be the coefficient of the aberration proportional to $\alpha_y^5$ affecting the position in the Y-direction. Here the coefficients $c_5$, $c_2$, $c_6$, $c_3$, and $c_7$ are also proportional to the aberration coefficients $\alpha_x^5$, $\alpha_x^4 \alpha_y$, $\alpha_x^3 \alpha_y^2$, $\alpha_x^2 \alpha_y^3$, and $\alpha_x \alpha_y^4$ affecting the position in Y-direction, respectively.

Let $\Delta V_1$, $\Delta V_2$, $\Delta V_3$, and $\Delta V_4$ be the increments of the electric potentials at the normal dodecapole fields in the first, second, third, and fourth stages, respectively. Let $\Delta V_5$, $\Delta V_6$, and $\Delta V_7$ be magnetic potentials corresponding to the increments of the electric potentials at the skew dodecapole fields in the first, second, and fourth stages, respectively.

When each increment $\Delta V_k$ (k=1 to 7) occurs, the aberration coefficient $c_j$ (j=1 to 7) varies. The aberration coefficients of the normal multipole fields vary independently of the aberration coefficients of the skew multipole fields. That is, the increment of the aberration coefficient of each normal multipole field (j, k=1 to 4) is given by $$\Delta c_j = \sum_{k=1}^{4} \frac{\partial c_j}{\partial V_k} \Delta V_k \equiv \sum_{k=1}^{4} a_{jk} \Delta V_k \qquad (8)$$

The increment of the aberration coefficient of each skew multipole field (j, k=5 to 7) is given by $$\Delta c_j = \sum_{k=5}^{7} \frac{\partial c_j}{\partial V_k} \Delta V_k \equiv \sum_{k=5}^{7} a_{jk} \Delta V_k \qquad (9)$$

Therefore, the increment $\Delta V_k$ that makes the aberration coefficient $c_j$ zero is found by solving the simultaneous equations normal multipole fields (j, k=1 to 3): $[a_{jk}][\Delta V_k] = [-c_j]$ skew multipole fields (j, k=5 to 7): $[a_{jk}][\Delta V_k] = [-c_j]$ As a result, for k=1 to 7, the corrective electric potential is given by $$V_k + \Delta V_k$$

In this way, the uncorrected aberration coefficient $c_j$ can be canceled out by an aberration coefficient $-c_j$ produced by the aberration corrector 10.

Where aperture aberrations have been corrected up to the fourth order, if electric and magnetic potentials for the aberration correction obtained as described above are set for the respective multipole fields, seven fifth-order aperture aberration coefficients $c_j$ (j=1 to 7) appearing in the calculation can be canceled to zero, the seven coefficients being contained in twelve fifth-order coefficients. It can also be confirmed that the other five fifth-order aperture aberration coefficients which do not appear in the calculation become substantially null at the same time. That is, the number of independent electric and magnetic potentials necessary for correction of the fifth-order aperture aberrations is four for normal dodecapole fields and is three for skew dodecapole fields. Thus, it can be seen that the object can be achieved by seven dodecapole fields in total.

The combination of the multipole fields selected to provide different aberration coefficients, magnetic potentials, and electric potentials as described above is so determined that greater aberration coefficient variations are produced when the electric or magnetic potentials are varied slightly. In actual corrections, if it is difficult to precisely measure the various aberration coefficients or corresponding amounts of blur from images, the direction in which blur of images is large for each potential increment $\Delta V_k$ is noted. Each increment $V_k$ is repetitively adjusted such that the image blur in this direction is minimized. Even if the system needs aberration corrections using skew hexapole electric potentials after the repetitive adjusting operations, the fifth-order aperture aberrations can all be made zero.

FIG. 5 illustrates a second embodiment of the invention. In the first embodiment described above, a dodecapole element is used as each multipole element. The electric or magnetic potentials to be applied to the electrodes or magnetic pole pieces are obtained by adding the electric or magnetic potentials in order to generate normal 2n-pole fields (where n=1 to 6) and electric or magnetic potentials in order to generate skew 2n-pole fields by means of the amplifiers $A_1$–$A_{12}$, and then the potentials are added.

It is to be noted that the theory has been simplified to facilitate the understanding. As shown in FIG. 5, the unit connected with the input of each amplifier $A_i$ (i=1 to 12) is at least one analog-to-digital (DA) converter. A signal corresponding to the sum of the electric or magnetic potentials in order to generate the normal 2n-pole fields and the electric or magnetic potential in order to generate the skew 2n-pole fields may be output from this DA converter. Furthermore, this DA converter may be made up of plural sections, e.g., a DA converter section for rough tuning and a DA converter section for fine tuning.

A third embodiment of the invention is next described by referring to Tables 3–6.

In the correction of the fifth-order aperture aberrations, a dodecapole element in normal array in terms of electric potentials is used as a dodecapole element. Similar advantages can be obtained if a dodecapole element in skew array is used.

In this case, magnetic potentials corresponding to $V_1$, $V_2$, $V_3$, and $V_4$ are applied to the first, second, third, and fourth stages, respectively, of multipole elements such that they act as normal dodecapole fields. Electric potentials $V_5$, $V_6$, and $V_7$ are applied to the first, second, and fourth stages, respectively, of multipole elements, such that they act as skew dodecapole fields. The fifth-order aperture aberrations can be corrected by the method identical with the above-described method of correcting the fifth-order aperture aberrations.

A fourth embodiment of the invention is next described. In the above embodiments, it has been assumed that normal hexapole and skew hexapole components coexist simultaneously. In actual instrument, however, the hexapole components may contain no skew hexapole components. Accordingly, if there are no skew hexapole components, skew octopole fields are unnecessary to correct spherical aberration (third-order aperture aberrations). No skew decapole fields are necessary to correct the fourth-order aperture aberrations. No skew dodecapole fields are necessary to correct the fifth-order aperture aberrations. For example, where corrective voltages are computationally found from aberration coefficients, amounts of aberrations or amount of image blur, for example, if it is already obvious that there are no skew multipole components, no problems will occur provided the equations for finding the electric potentials of the skew multipole fields are removed from the simultaneous equations. Rather, this simplifies the equations.

A fifth embodiment of the invention is next described. In the above-described embodiment using magnetic field type dodecapole elements, independent power supplies are connected with the coils of the dodecapole elements. In a case where either the second-, third-, and fourth-order aperture aberrations or the normal or skew components of the fifth-order aperture aberrations are corrected with an electrostatic dodecapole element, the remaining fifth-order aperture aberrations are corrected by a magnetic field type dodecapole element, which is described in further detail now. In the first and fourth stages of the dodecapole elements, the magnetic field type dodecapole element is used only for generation of a dodecapole field. The twelve coils are connected in series taking account of their polarities, i.e., the adjacent polarities are opposite to each other. Thus, only one power supply is necessary for one dodecapole element. With respect to the central second and third stages of the magnetic dodecapole elements, only the aforementioned normal or skew dodecapole field is added to the prior art quadrupole field for correcting chromatic aberration. Therefore, coils used only to produce quadrupole fields and coils used only for dodecapole fields can be mounted separately. The coils used only for the dodecapole fields are connected in series, taking account of their polarities (i.e., the adjacent polarities are opposite to each other). In this way, only one power supply is necessary for one dodecapole field. This can reduce the number of power supplies. In addition, it has been experimentally found that generation of unwanted deflecting fields due to minute deviations of the outputs from the power supplies can be reduced.

By expanding the theory described so far, aperture aberrations of higher than the fifth order should be corrected similarly. For example, in the case of a charged-particle optical system using a beam of charged particles having higher energy, it might be expected that correction of aperture aberrations of higher than the fifth order would produce advantages.

It is to be understood that the present invention is not limited to the embodiment as already described in connection with FIG. 1. The invention can also be applied to a case where an additional lens is mounted between the aberration corrector 10 and the objective lens 7, to a case where an aperture angle control lens is mounted ahead of the aberration corrector 10, and to a case where a transfer lens is mounted between the aberration corrector 10 and the objective lens 7.

As described so far, one embodiment of the invention provides a charged-particle optical system having (1) four stages of multipole elements and (2) independently variable power supplies capable of supplying five or more independent octopole electric potentials or magnetic potentials. The (2) independently variable power supplies apply electric or magnetic potentials for generating normal octopole fields to at least three multipole elements of the four stages independently and apply the electric or magnetic potentials for generating skew octopole fields to at least two multipole elements independently. There are also provided (3) fixed or non-independently variable power supplies capable of supplying one or more octopole electric potentials or magnetic potentials having a value that is constant or dependent on any of the independently variable power supplies. The (3) fixed or non-independently variable power supplies apply electric or magnetic potentials for generating normal octopole fields or electric or magnetic potentials for generating skew octopole fields to at least one multipole element of the four stages. There is also provided (4) an aberration corrector for correcting spherical aberration (third-order aperture aberrations) from variations in images obtained by adjusting the five or more octopole electric or magnetic potentials independently. Thus, if normal and skew hexapole components are corrected within the aberration corrector, the spherical aberration (third-order aperture aberrations) can be corrected substantially to zero. Where the fourth-order or higher-order aperture aberrations are corrected, the remaining components of the spherical aberration will not deteriorate the probe diameter (i.e., a finer probe can be obtained).

Another embodiment of the invention provides a charged-particle optical system having (1) four stages of multipole elements and (2) independently variable power supplies capable of supplying six or more independent decapole electric or magnetic potentials. The independently variable power supplies apply electric or magnetic potentials for generating normal decapole fields to at least three multipole elements of the four stages independently and apply electric or magnetic potentials for generating skew decapole fields to at least three multipole elements independently. There are also provided (3) fixed or non-independently variable power supplies capable of supplying one or more decapole electric potentials or magnetic potentials having a value that is constant or dependent on any of the independently variable power supplies. The (3) fixed or non-independently variable power supplies apply electric or magnetic potentials for generating normal decapole fields or the electric or magnetic potentials for generating skew decapole fields to at least one multipole element of the four stages. Furthermore, there is provided (4) an aberration corrector for correcting fourth-order aperture aberration from variations in images obtained by independently adjusting the six or more decapole electric or magnetic potentials. Therefore, if the normal and skew hexapole components are corrected within the aberration corrector, the fourth-order aperture aberrations can be corrected substantially to zero. Where the fifth-order aperture aberrations are corrected, the fourth-order aperture aberrations are prevented from limiting the probe diameter.

A further embodiment of the invention provides a charged-particle optical system having (1) four stages of multipole elements and (2) independently variable power supplies capable of supplying seven independent dodecapole electric or magnetic potentials. Electric or magnetic potentials for generating normal dodecapole fields are applied to all of the four multipole elements independently. The electric or magnetic potentials for generating skew dodecapole fields are applied to three multipole elements independently. There is also provided (3) a non-independently variable power supply capable of supplying dodecapole electric or magnetic potential having a value that is constant or dependent on any of the independently variable power supplies. The electric or magnetic potential for generating a skew dodecapole field is applied to one multipole element of the four stages. Furthermore, there is provided (4) an aberration corrector for correcting the fifth-order aperture aberrations from variations in images obtained by independently adjusting the seven dodecapole electric or magnetic potentials. Therefore, if the normal and skew hexapole components are corrected within the aberration corrector, the fifth-order aperture aberrations can be corrected substantially to zero. Aperture aberrations can also be made zero up to the fifth order. The probe diameter can be reduced greatly.

Still further, where each of the four stages of multipole elements is made of a dodecapole element having a normal array and of the superimposed electric and magnetic field type, normal dodecapole fields are created by electric potentials. Skew dodecapole fields are created by magnetic potentials. Electric potentials for generating the normal dodecapole fields are applied to all of the four multipole elements independently. Magnetic potentials for generating the skew dodecapole fields are applied to three multipole elements independently. There is also provided an aberration corrector for correcting the fifth-order aperture aberrations from variations in images obtained by adjusting these four independent electric potentials and three or more independent magnetic potentials. Consequently, correction can be performed up to the fifth order with the dodecapole elements. Additionally, correction performed with an increased number of poles is dispensed with. Hence, low-cost, high-performance correction is made possible.

Where each of the four stages of multipole elements is made up of the dodecapole element of the superimposed electric and magnetic field type having a skew array, normal dodecapole fields are created by magnetic potentials. Skew dodecapole fields are created by electric potentials. Magnetic potentials for generating the normal dodecapole fields are applied to all of the four multipole elements independently. Electric potentials for generating the skew dodecapole fields are applied to three multipole elements independently. The aberration corrector corrects the fifth-order aperture aberrations from variations in images obtained by adjusting these four independent dodecapole magnetic potentials and three independent electric potentials. In consequence, correction can be performed up to the fifth order with the dodecapole elements. Correction performed with an increased number of poles can be dispensed with. Low-cost, high-performance correction is made possible.

The present invention has been described in detail so far. By way of precaution, the gist of the invention is summarized as follows.

Essentially, second-order aperture aberrations occur dependent on the mechanical accuracy and assembly accuracy. Therefore, in the past, it has been considered that the second-order aperture aberrations can be made negligible by sufficiently enhancing such mechanical accuracy. However, if aberration in a charged-particle optical system is corrected utmostly, the mechanical accuracy and assembly accuracy must be enhanced also utmostly, which is technically and economically difficult to achieve. Accordingly, where maximum performance of the aberration corrector should be derived, the second-order aperture aberrations cannot be neglected.

If the second-order aperture aberrations cannot be neglected, it is obvious that the second-order aperture aberrations affect higher-order aberrations. Therefore, the second-order aperture aberrations must be taken into account in correcting higher-order aberrations. For this purpose, eight multipole fields consisting of four stages of normal multipole fields and skew multipole fields need to be controlled independently. Then, conditions under which aberrations are corrected optimally need to be searched for. The system is then set to the found conditions.

Certainly, these are the necessary operations in principle. However, there are many factors that must be adjusted independently. This means that it is quite difficult to manually manipulate the system. Furthermore, there arise inconveniences. For example, plural solutions are obtained in correcting some aberration. Voltages applied to the multipole elements in practice assume excessively high values. If such high voltages are applied, new aberrations are produced. In view of these situations, it is desired that fewer factors be appropriately selected from independent factors in practical applications.

The present invention provides a technique for reducing the number of independent factors to a minimum and teaching what of eight octopole fields should be selected as factors that must be adjusted independently. In particular, the number of independent factors in correcting the third-order aperture aberrations (spherical aberration) is five. The number of independent factors in correcting the fourth-order aperture aberrations is six. The number of independent factors in correcting the fifth-order aperture aberrations is seven. Multipole fields are selected as concretely independent factors. Aberrations can be easily corrected by making adjustments using the selected multipole fields. The operational practicality of the charged-particle optical system having the built-in aberration corrector can be enhanced.

The present invention can offer a charged-particle optical system that achieves optimum aberration correction and results in a minimum probe diameter.

Having thus described our invention with the detail and particularity required by the Patent Laws, what is desired protected by Letters Patent is set forth in the following claims.

What is claimed is:

1. A charged-particle optical system for focusing a beam of charged particles onto a specimen, said optical system comprising:
   (1) four stages of multipole elements arranged along an optical axis of the beam of charged particles;
   (2) independently variable power supplies capable of supplying six or more independent octopole electric or magnetic potentials, said independently variable power supplies applying electric or magnetic potentials for generating normal octopole fields to at least three stages of multipole elements of said four stages of multipole elements independently and applying electric or magnetic potentials for generating skew octopole fields to at least two stages of the multipole elements independently;

(3) fixed or non-independently variable power supplies capable of supplying one or more octopole electric or magnetic potentials, said non-independently variable power supplies applying electric or magnetic potentials for generating normal or skew octopole fields having values that are constant or dependent on any value of said independently variable power supplies to at least one stage of multipole elements of said four stages of multipole elements, said skew fields having functions equivalent to those of a structure obtained by rotating the normal field by one half the pitch between multipole elements; and (4) a control means for correcting third-order aperture aberrations by independently adjusting the octopole electric or magnetic potentials of said five or more independently variable power supplies.

2. The charged-particle optical system set forth in claim 1, wherein at least two of the electric or magnetic potentials for generating said independent normal octopole fields are applied to central second and third stages of said multipole elements, and wherein at least two of the electric or magnetic potentials for generating said independent skew octopole fields are applied to the first and fourth stages of multipole elements.

3. The charged-particle optical system set forth in any one of claims 1 and 2, further comprising:

independently variable power supplies capable of supplying six or more independent decapole electric or magnetic potentials, said independently variable power supplies applying electric or magnetic potentials for generating normal decapole fields to at least three stages of multipole elements of said four stages of multipole elements independently and applying electric or magnetic potentials for generating skew decapole fields to at least three of the stages of multipole elements independently; and a control means for correcting fourth-order aperture aberrations by independently adjusting said six or more octopole electric or magnetic potentials of the independently variable power supplies.

4. The charged-particle optical system set forth in any one of claims 1 and 2, further comprising:

independently variable power supplies capable of supplying seven independent dodecapole electric or magnetic potentials, said independently variable power supplies applying electric or magnetic potentials for generating normal dodecapole fields to all of said four stages of multipole elements independently and applying electric or magnetic potentials for generating skew dodecapole fields to three of the stages of multipole elements independently; and a control means for correcting fifth-order aperture aberrations by independently adjusting said seven dodecapole electric or magnetic potentials.

5. The charged-particle optical system set forth in any one of claims 1 and 2, wherein each of said four stages of multipole elements is made up of a dodecapole element and at least two central stages of said four stages of dodecapole elements are of superimposed electric and magnetic field types, and wherein there are further provided independently variable power supplies for applying four independent quadrupole electric potentials to said four stages of dodecapole elements and for applying at least two independent quadrupole magnetic potentials to the stages of multipole elements of said superimposed electric and magnetic field types.

6. A charged-particle optical system for focusing a beam of charged particles onto a specimen, said optical system comprising:

(1) four stages of multipole elements arranged along an optical axis of the beam of charged particles;

(2) independently variable power supplies capable of supplying six or more independent decapole electric or magnetic potentials, said independently variable power supplies applying electric or magnetic potentials for generating normal decapole fields to at least three stages of multipole elements of said four stages of multipole elements independently and applying electric or magnetic potentials for generating skew decapole fields to at least three stages of the multipole elements independently;

(3) fixed or non-independently variable power supplies capable of supplying one or more decapole electric or magnetic potentials, said non-independently variable power supplies applying electric or magnetic potentials for generating normal or skew decapole fields having values that are constant or dependent on any value of said independently variable power supplies to at least one stage of multipole element elements of said four stages of multipole elements; said skew fields having functios equivalent to those of a structure obtained by rotating the normal field by one half the pitch between multipole elements; and (4) a control means for correcting fourth-order aperture aberrations by adjusting the decapole electric or magnetic potentials of said six or more independently variable power supplies independently.

7. The charged-particle optical system set forth in claim 6, wherein at least one of the electric or magnetic potentials for generating said independent normal decapole fields is applied to said multipole elements in the second stage, and wherein at least one of the electric or magnetic potentials for generating said independent skew decapole field is applied to said multipole elements in the third stage.

8. The charged-particle optical system set forth in claim 6, wherein at least three of the electric or magnetic potentials for generating said independent normal decapole fields are applied to said multipole elements in the first, second, and fourth stages, and wherein at least three of the electric or magnetic potentials for generating said independent skew decapole fields are applied to said multipole elements in the first, third, and fourth stages.

9. The charged-particle optical system set forth in any one of claims 6 to 8, further comprising:

independently variable power supplies capable of supplying seven independent dodecapole electric or magnetic potentials, said independently variable power supplies applying the electric or magnetic potentials for generating normal dodecapole fields to all of said four stages of multipole elements independently and applying the electric or magnetic potentials for generating skew dodecapole fields to three of the stages of multipole elements independently; and a control means for correcting fifth-order aperture aberrations by adjusting said seven dodecapole electric or magnetic potentials independently.

10. The charged-particle optical system setforth in any one of claims 1, 2, 6, 7 or 8 wherein each of said four stages of multipole elements is made up of a dodecapole element and at least two central stages of said four stages of dodecapole elements are of the superimposed electric and magnetic field types, and wherein there are further provided independently variable power supplies for applying four independent quadrupole electric potentials to said four stages of dodecapole elements and for applying at least two independent quadrupole magnetic potentials to the multipole elements of said superimposed electric and magnetic field types.

11. A charged-particle optical system for focusing a beam of charged particles onto a specimen, said optical system comprising:
  (1) four stages of multipole elements arranged along an optical axis of the beam of charged particles;
  (2) independently variable power supplies capable of supplying seven independent dodecapole electric or magnetic potentials, said independently variable power supplies applying electric or magnetic potentials for generating normal dodecapole fields to all of said four stages of multipole elements independently and applying electric or magnetic potentials for generating skew dodecapole fields to three of said stages of multipole elements independently;
  (3) fixed or a non-independently variable power supply capable of supplying one dodecapole electric or magnetic potential, said non-independently variable power supply applying an electric or magnetic potential for generating a skew dodecapole field having a value that is constant or dependent on any value of said independently variable power supplies to one stage of multipole element of said four stages of multipole elements, said skew fields having functions equivalent to those of a structure obtained by rotating the normal field by one half the pitch between multipole elements; and
  (4) a control means for correcting fifth-order aperture aberrations by adjusting dodecapole electric or magnetic potentials of said seven independently variable power supplies independently.

12. The charged-particle optical system set forth in claim 11, wherein electric or magnetic potentials for generating said independent skew dodecapole fields are applied to said multipole elements in the first, second, and fourth stages.

13. The charged-particle optical system set forth in any one of claims 11 and 12, wherein each of said four stages of multipole elements is made up of a dodecapole element and at least two central stages of said four stages of dodecapole elements are of the superimposed, electric and magnetic field types, and wherein there are further provided independently variable power supplies for applying four independent quadrupole electric potentials to said four stages of dodecapole elements and for applying at least two independent quadrupole magnetic potentials to the multipole elements of said superimposed field type.

14. A charged-particle optical system for focusing a beam of charged particles onto a specimen, said optical system comprising:
  (1) four stages of multipole elements using dodecapole elements of superimposed electric and magnetic field types in normal array arranged along an optical axis of the beam of charged particles;
  (2) independently variable power supplies for applying electric potentials for generating normal dodecapole fields to all of said four stages of multipole elements independently and applying magnetic potentials for generating skew dodecapole fields to three stages of the multipole elements independently;
  (3) fixed or a non-independently variable power supply capable of supplying one dodecapole magnetic potential, said non-independently variable power supply applying a magnetic potential for generating a skew dodecapole field having a value that is constant or dependent on any value of said independently variable power supplies to one multipole element of said four stages of multipole elements, said skew fields having functions equivalent to those of a structure obtained by rotating the normal field by one half the pitch between multipole elements; and
  (4) a control means for correcting fifth-order aperture aberrations by adjusting said four independent dodecapole electric potentials and said three independent dodecapole magnetic potentials.

15. A charged-particle optical system for focusing a beam of charged particles onto a specimen, said optical system comprising:
  (1) four stages of multipole elements using dodecapole elements of superimposed electric and magnetic field types in skew array arranged along an optical axis of the beam of charged particles;
  (2) independently variable power supplies for applying magnetic potentials for generating normal dodecapole fields to all of said four stages of multipole elements independently and applying electric potentials for generating skew dodecapole fields to three stages of the multipole elements;
  (3) a non-independently variable power supply capable of supplying one dodecapole electric potential, said non-independently variable power supply applying an electric potential for generating a skew dodecapole field having a value that is constant or dependent on any value of said independently variable power supplies to one multipole element of said four stages of multipole elements, said skew fields having functions equivalent to those of a structure obtained by rotating the normal field by one half the pitch between multipole elements; and
  (4) a control means for correcting fifth-order aperture aberrations by adjusting said four independent dodecapole magnetic potentials and said three independent dodecapole electric potentials.

* * * * *

UNITED STATES PATENT AND TRADEMARK OFFICE
CERTIFICATE OF CORRECTION

PATENT NO.        : 7,015,481 B2                                    Page 1 of 9
APPLICATION NO. : 10/778937
DATED             : March 21, 2006
INVENTOR(S)       : Miyuki Matsuya It is certified that error appears in the above-identified patent and that said Letters Patent is hereby corrected as shown below:

(1) Replace the informal drawings that issued with the patent with the attached formal drawings.

(2) Column 32, Line 62, Claim 1, "supplying six or more" should read -- supplying five or more --

(3) Column 33, Line 8, Claim 1, "normal or skew octopole fields" should read -- a normal or skew octopole field --

(4) Column 33, Line 43, Claim 3, "octopole electric" should read -- decapole electric --

(5) Column 34, Line 3, Claim 6, "focusinga beam" should read -- focusing a beam --

(6) Column 34, Line 25, Claim 6, "element elements" should read -- elements --

(7) Column 34, Line 27, Claim 6, "functios equivalent" should read -- functions equivalent --

(8) Column 34, Line 63, Claim 10, "system setforth" should read -- system set forth --

Signed and Sealed this

Twentieth Day of February, 2007

JON W. DUDAS
*Director of the United States Patent and Trademark Office*

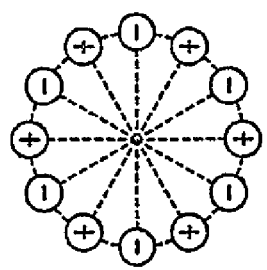
FIG.8(E) NORMAL DODECAPOLE
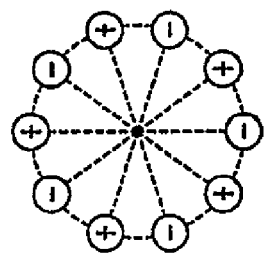
FIG.8(D) NORMAL DECAPOLE
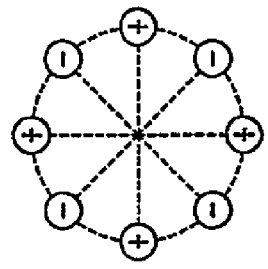
FIG.8(C) NORMAL OCTOPOLE
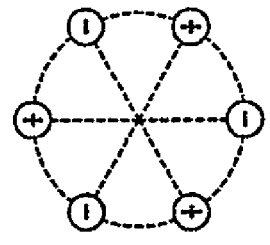
FIG.8(B) NORMAL HEXAPOLE
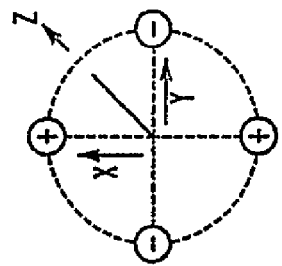
FIG.8(A) NORMAL QUADRUPOLE
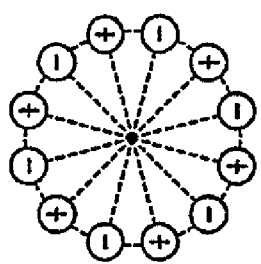
FIG.8(J) SKEW DODECAPOLE
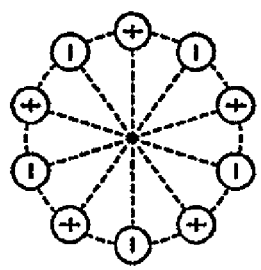
FIG.8(I) SKEW DECAPOLE
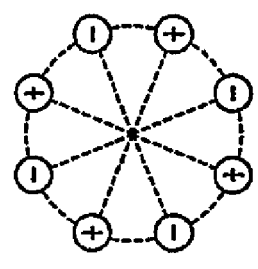
FIG.8(H) SKEW OCTOPOLE
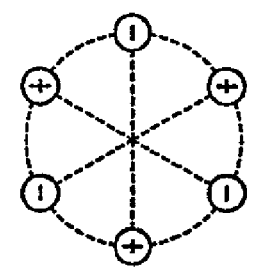
FIG.8(G) SKEW HEXAPOLE
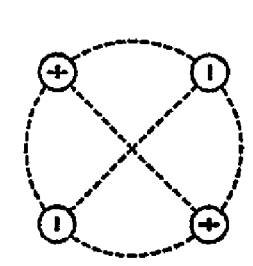
FIG.8(F) SKEW QUADRUPOLE